United States Patent
Yamamoto et al.

(10) Patent No.: US 11,521,855 B2
(45) Date of Patent: Dec. 6, 2022

(54) PATTERN FORMATION METHOD AND METHOD OF MANUFACTURING SEMICONDUCTOR DEVICE

(71) Applicant: Kioxia Corporation, Tokyo (JP)

(72) Inventors: Ryosuke Yamamoto, Aichi (JP); Koji Asakawa, Kanagawa (JP); Ayaka Suko, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 24 days.

(21) Appl. No.: 17/010,021

(22) Filed: Sep. 2, 2020

(65) Prior Publication Data

US 2021/0296117 A1    Sep. 23, 2021

(30) Foreign Application Priority Data

Mar. 17, 2020 (JP) .............................. JP2020-046975

(51) Int. Cl.
*H01L 21/027* (2006.01)
*H01L 21/02* (2006.01)
*G03F 7/00* (2006.01)

(52) U.S. Cl.
CPC ........ *H01L 21/0271* (2013.01); *G03F 7/0002* (2013.01); *H01L 21/02118* (2013.01); *H01L 21/02282* (2013.01); *H01L 21/02337* (2013.01)

(58) Field of Classification Search
None
See application file for complete search history.

(56) References Cited

U.S. PATENT DOCUMENTS

| | | |
|---|---|---|
| 8,980,418 B2 | 3/2015 | Darling |
| 10,395,899 B2 | 8/2019 | Saito |
| 2013/0244439 A1* | 9/2013 | Ghariehali ........ H01L 21/31058 438/703 |
| 2014/0170405 A1 | 6/2014 | Makino |
| 2017/0141036 A1* | 5/2017 | Civay ............... H01L 21/76823 |
| 2019/0080887 A1* | 3/2019 | Saito ................. H01L 21/31058 |
| 2019/0086805 A1 | 3/2019 | Asakawa |
| 2019/0259606 A1 | 8/2019 | Yamamoto |

FOREIGN PATENT DOCUMENTS

JP    2017-034103 A    2/2017

* cited by examiner

*Primary Examiner* — Alexander G Ghyka
(74) *Attorney, Agent, or Firm* — Foley & Lardner LLP

(57) ABSTRACT

A pattern formation method includes forming an organic film on a substrate, processing the organic film to form an organic film pattern, exposing the organic film pattern to an organic gas, and exposing the organic film pattern to a metal-containing gas, and after (i) exposing the organic film pattern to the organic gas and (ii) exposing the organic film pattern to the metal-containing gas, treating the organic film pattern with an oxidizing agent.

19 Claims, 16 Drawing Sheets

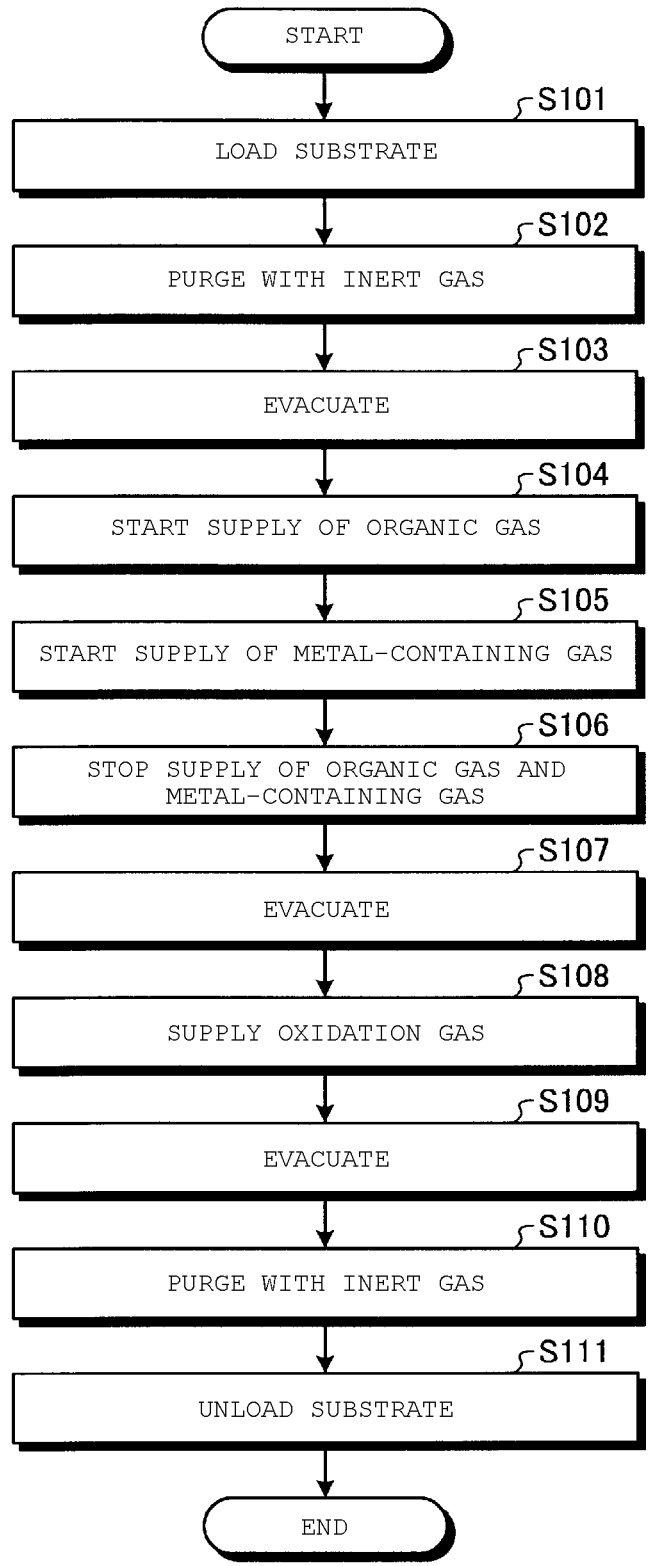

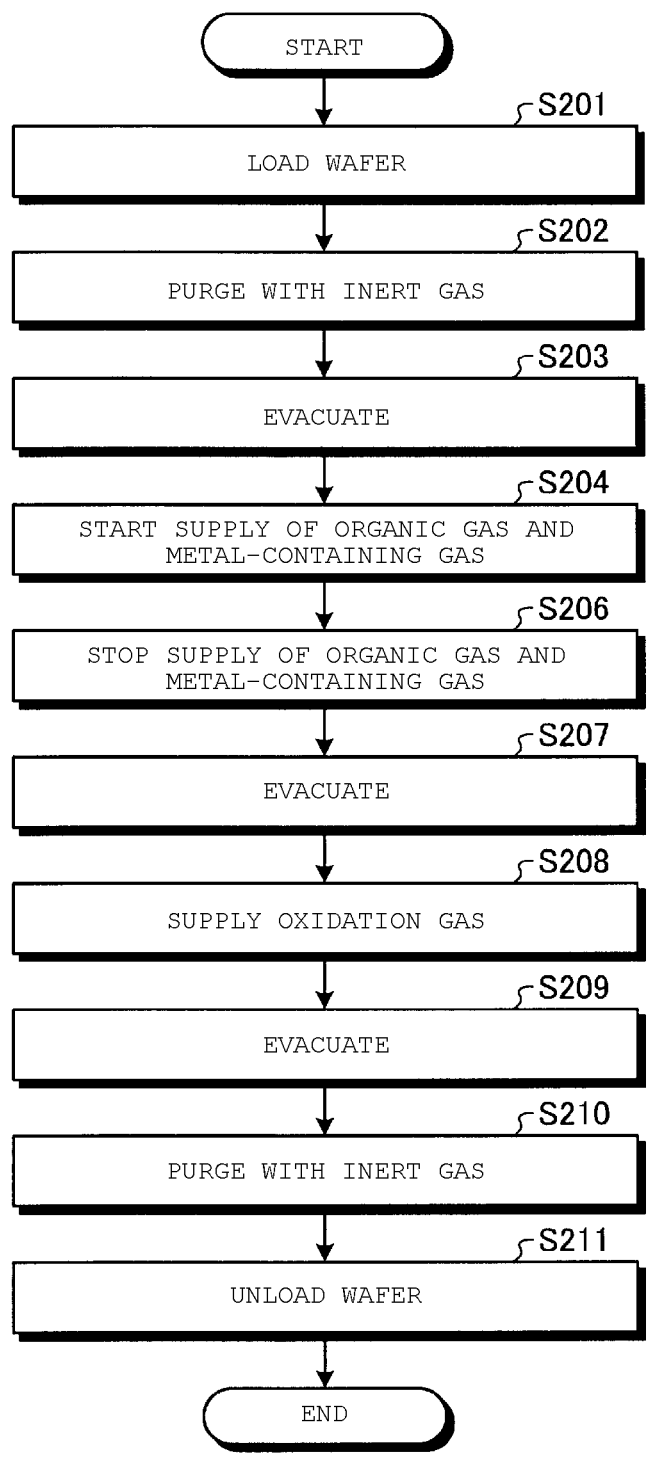

PATTERN FORMATION METHOD AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2020-046975, filed Mar. 17, 2020, the entire contents of which are incorporated herein by reference.

FIELD

Embodiments described herein relate generally to a pattern formation method and a method of manufacturing a semiconductor device.

BACKGROUND

In a manufacturing step of a semiconductor device, a film to be processed may be etched using an organic film such as a resist film as a mask. A treatment of infiltrating a metal into the organic film in order to improve an etching resistance of the organic film is known. By increasing the amount of metal infiltrated into the organic film, the etching resistance of the organic film may be further improved.

Examples of related art include U.S. Pat. Nos. 8,980,418 and 10,395,899.

DESCRIPTION OF THE DRAWINGS

FIG. 5 is a flowchart illustrating an example of a procedure of a pattern formation method by the substrate treatment apparatus according to at least one embodiment.

FIG. 8 is a flowchart illustrating an example of a procedure of a pattern formation method by the substrate treatment apparatus according to the modification example of at least one embodiment.

DETAILED DESCRIPTION

At least one embodiments provides a pattern formation method and a method of manufacturing a semiconductor device which may increase the amount of metal infiltrated into an organic film.

In general, according to at least one embodiment, a pattern formation method includes forming an organic film on a substrate, processing the organic film to form an organic film pattern, exposing the organic film pattern to an organic gas, exposing the organic film pattern to a metal-containing gas, and after (i) exposing the organic film pattern to the organic gas and (ii) exposing the organic film pattern to the metal-containing gas, treating the organic film pattern with an oxidizing agent.

Hereinafter, embodiments of the present disclosure will be described in detail with reference to the drawings. It is noted that the present disclosure is not limited to the embodiments described below. In addition, elements in the following embodiments include those that may be easily assumed by those skilled in the art or those that are substantially the same.

Embodiment

In a manufacturing step of a semiconductor device, a treatment is known in which an organic film such as a resist film used as a mask is infiltrated with a metal to enhance an etching resistance of the organic film. As a method of infiltrating the metal into the organic film, for example, after exposing the organic film to a precursor such as trimethylaluminum (TMA) used in a chemical vapor deposition (CVD) method or an atomic layer deposition (ALD) method, the organic film is subjected to an oxidation treatment to deposit each or a compound of the metals in the precursor in the organic film. In general, it is considered that the higher the amount of metal infiltrated into the organic film, the higher the etching resistance of the organic film.

However, in the organic film used as the mask in the manufacturing step of the semiconductor device, the etching resistance may be improved by increasing a crosslink density, for example. In addition, by increasing the crosslink density, the solvent resistance of the organic film is improved, and it is also possible to form a film by a spin coating method on the organic film. As described above, when the crosslink density of the organic film is high, and when the film density itself is high due to a high density of the polymer chains forming the organic film, it may be difficult to infiltrate the metal into the organic film, and a sufficient amount of infiltration may not be obtained.

In addition, when the molecular size of the precursor is large, such as tetrakis(dimethylamide) titanium (TDMAT), infiltration of the metal into the organic film may be hindered and the amount of infiltration may be reduced.

The embodiments described below are intended to solve the above problems. Hereinafter, embodiments will be described in detail with reference to the drawings.

Example of Configuration of Substrate Treatment Apparatus

Figure 1:
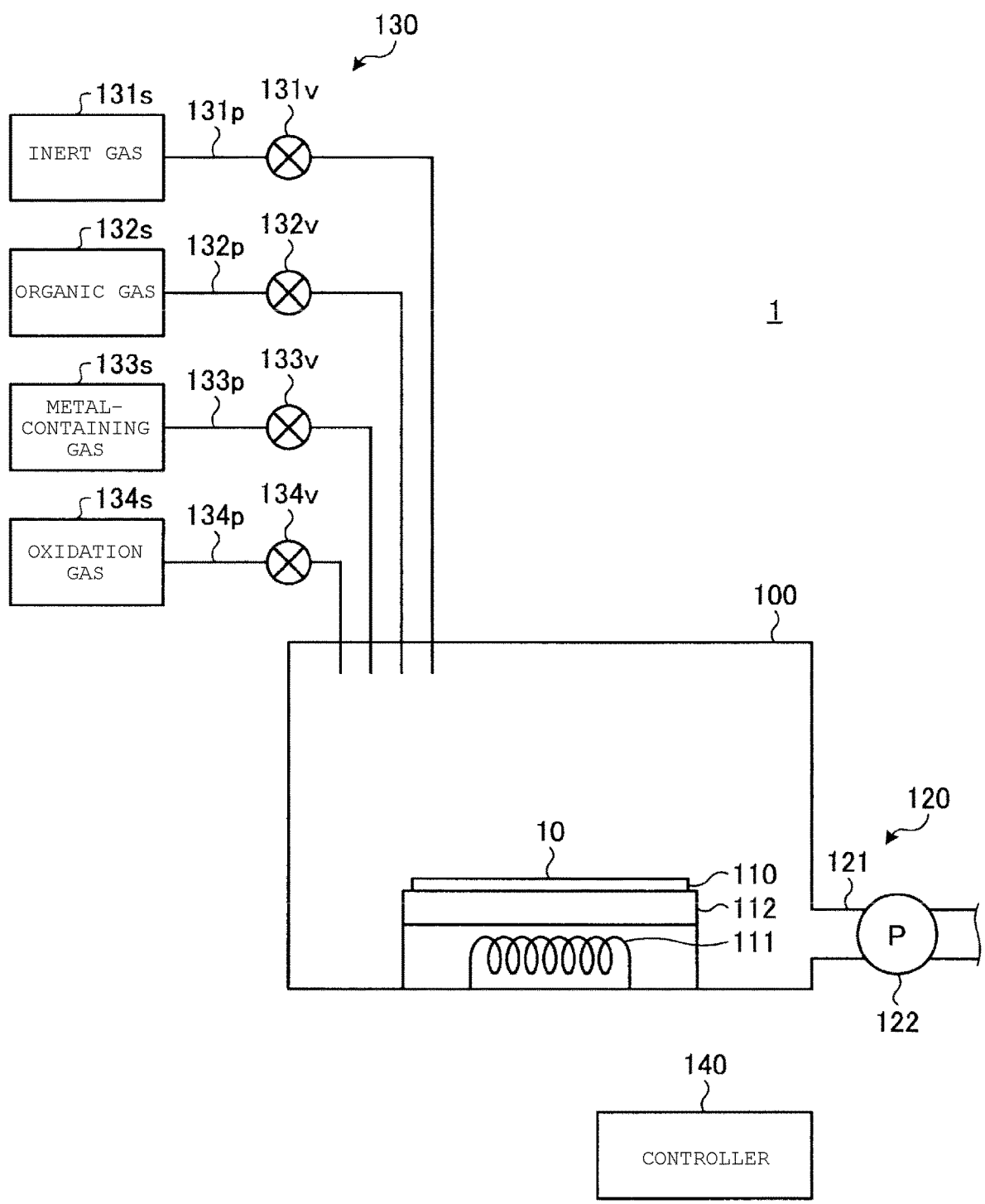
FIG. 1 is a diagram illustrating an example of a configuration of a substrate treatment apparatus according to at least one embodiment.

FIG. 1 is a diagram illustrating an example of a configuration of a substrate treatment apparatus 1 according to at least one embodiment. The substrate treatment apparatus 1 is an apparatus that performs a metal infiltration treatment in which the organic film formed on the substrate 10 is infiltrated with the metal.

Examples of the organic film that may be a target of the metal infiltration treatment by the substrate treatment apparatus 1 include a resist film used in photolithography treatment or imprint lithography treatment, and a carbon (SOC: Spin-On-Carbon) film. The resist film contains, for example, a polymer of acrylic acid ester or a copolymer of acrylic acid ester and methacrylic acid ester as a main component. The SOC film may be, for example, an organic film whose main component is carbon.

As illustrated in FIG. 1, the substrate treatment apparatus 1 is provided with a treatment container 100, a stage 110, an exhaust system 120, a gas supply system 130, and a controller 140. Additionally, the substrate treatment apparatus 1 may be provided with a conveyance system (not illustrated) that loads and unloads the substrate 10 into and from the treatment container 100.

The treatment container 100 is configured with a closed container capable of keeping the inside airtight, and accommodates the substrate 10 to perform the metal infiltration treatment.

For example, the stage 110 that supports the substrate 10 is provided in a lower center in the treatment container 100. The stage 110 is provided with a temperature regulating mechanism 111 such as a heater inside, and an adsorption mechanism 112 such as an electrostatic chuck that adsorbs the substrate 10 on an upper portion thereof, and supports the substrate 10 on the upper surface and adjusts the temperature of the substrate 10 to a desired set temperature.

An exhaust pipe 121 is connected to the treatment container 100, and a pump 122 for evacuating the atmosphere in the treatment container 100 to adjust the pressure inside the treatment container 100 to a desired pressure is provided in the exhaust pipe 121. The exhaust pipe 121 and the pump 122 form an exhaust system 120.

A plurality of gas pipes 131p to 134p are connected to the treatment container 100.

A valve 131v is provided in the gas pipe 131p, and an inert gas supply source 131s is connected to the other end of the gas pipe 131p. When the valve 131v is opened, a supply of the inert gas from the inert gas supply source 131s into the treatment container 100 via the gas pipe 131p is started. When the valve 131v is closed, the supply of the inert gas into the treatment container 100 is stopped.

As the inert gas, for example, a rare gas such as helium gas and argon gas, or nitrogen gas may be used. A plurality of types of these gases may be mixed and used.

A valve 132v is provided on a gas pipe 132p, and an organic gas supply source 132s is connected to the other end of the gas pipe 132p. When the valve 132v is opened, a supply of the organic gas from the organic gas supply source 132s into the treatment container 100 via the gas pipe 132p is started. When the valve 132v is closed, the supply of the organic gas into the treatment container 100 is stopped.

As the organic gas, vaporized gases of various organic solvents may be used. An organic solvent contained in the organic gas is preferably a solvent which has a high affinity for the organic film to be treated such as the resist film or the SOC film described above and has a low reactivity with a precursor described later. The affinity with the organic film may be selected based on, for example, a solubility parameter. That is, an organic solvent having a solubility parameter close to that of the organic film to be treated may be selected.

Examples of organic solvents that may be used include chain ketones such as acetone, methyl ethyl ketone, diethyl ketone, and methyl isobutyl ketone; cyclic ketones such as cyclopentanone and cyclohexanone; aliphatic hydrocarbons such as hexane, cyclohexane, methyl cyclohexane, ethyl cyclohexane, heptane, and octane; aromatic hydrocarbons such as toluene, ethyl benzene, and xylene; and ethers such as glyme, diglyme, triglyme, dioxane, and tetrahydrofuran. Of these, one organic solvent may be used alone, or a plurality of organic solvents may be mixed and used.

It is noted that an organic solvent having a hydroxyl group (—OH) such as alcohols reacts with a precursor described later, and thus the organic solvent is unsuitable as an organic solvent used for an organic gas.

A valve 133v is provided on a gas pipe 133p, and a metal-containing gas supply source 133s is connected to the other end of the gas pipe 133p. When the valve 133v is opened, a supply of a metal-containing gas from the metal-containing gas supply source 133s into the treatment container 100 via the gas pipe 133p is started. When the valve 133v is closed, the supply of the metal-containing gas into the treatment container 100 is stopped.

As the metal-containing gas, various precursors used in, for example, the CVD method or the ALD method may be used. Examples of the precursors that may be used include trimethylaluminum (TMA), trimethylgallium (TMGa), trimethylindium (TMI), tetrakis(dimethylamide) titanium (TDMAT), tetrakis(dimethylamide) hafnium (TDMAH), and tetrakis(dimethylamide) zirconium (TDMAZ).

The precursors listed above contain aluminum, gallium, indium, titanium, hafnium, and zirconium as metal atoms, respectively. In addition to these, for example, a precursor containing any one of chromium, manganese, molybdenum, and tungsten may be used.

In addition, the metal-containing gas may be a gas in which any one of the above-described precursors is mixed with an organic solvent. Such a mixed gas may be used, for example, when the vapor pressure of the precursor is low and it is difficult to vaporize. In addition, by using a solvent having a high affinity with the organic film to be treated, it is possible to enhance a function of a solvent annealing treatment using the above various organic solvents. Therefore, the organic solvent is preferably a low molecular solvent which can dissolve the above-described precursor, and has low reactivity with the precursor, and is more preferably a solvent having a high affinity with the organic film to be treated.

Example of the organic solvent that may be used may be selected from organic solvents that may be used for the solvent annealing treatment, and include aliphatic hydrocarbons such as hexane, cyclohexane, methyl cyclohexane, ethyl cyclohexane, heptane, and octane; aromatic hydrocarbons such as toluene, ethyl benzene, and xylene; and ethers such as glyme, diglyme, triglyme, dioxane, and tetrahydrofuran. Of these, one organic solvent may be used alone, or a plurality of organic solvents may be mixed and used.

A valve 134v is provided on a gas pipe 134p, and an oxidation gas supply source 134s is connected to the other end of the gas pipe 134p. When the valve 134v is opened, a supply of the oxidation gas from the oxidation gas supply source 134s into the treatment container 100 via the gas pipe 134p is started. When the valve 134v is closed, the supply of the oxidation gas into the treatment container 100 is stopped.

As the oxidation gas, water vapor ($H_2O$ gas), hydrogen peroxide solution ($H_2O_2$) gas, ozone ($O_3$) gas as an oxidizing agent may be used.

The gas pipes 131p to 134p, the valves 131v to 134v, the inert gas supply source 131s, the organic gas supply source 132s, the metal-containing gas supply source 133s, and the oxidation gas supply source 134s form a gas supply system 130.

The controller 140 may be configured as a computer provided with a central processing unit (CPU), a random access memory (RAM), a read only memory (ROM), and the like. The RAM, the ROM, and the like are configured to exchange data with the CPU via an internal bus.

The CPU of the controller 140 reads a control program from the ROM, and controls the stage 110, the exhaust system 120, the gas supply system 130, and the conveyance system (not illustrated) according to the content of the read control program.

Operation Example of Substrate Treatment Apparatus

Figure 2A:
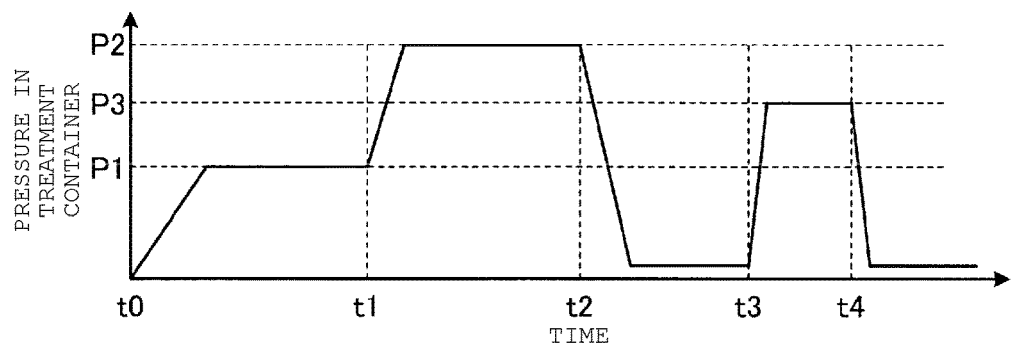
FIGS. 2A to 2D are timing charts illustrating a timing of gas supply and pressure control in the substrate treatment apparatus according to at least one embodiment.

Next, an operation example of the substrate treatment apparatus 1 according to the embodiment will be described with reference to FIG. 2. FIG. 2 are timing charts illustrating a timing of gas supply and pressure control in the substrate treatment apparatus 1 according to at least one embodiment. The horizontal axis of the timing charts of FIGS. 2A to 2D is time, the vertical axis of the timing chart of FIG. 2A is a pressure (total pressure) in the treatment container 100 of the substrate treatment apparatus 1, the vertical axis of the timing chart of FIG. 2B is a pressure of the organic gas, the vertical axis of the timing chart of FIG. 2C is a pressure of the metal-containing gas, and the vertical axis of the timing chart of FIG. 2D is a pressure of the oxidation gas.

It is noted that prior to the control illustrated in FIG. 2, the substrate 10 on which the organic film is formed is loaded into the treatment container 100 by the conveyance system (not illustrated) and placed on the upper surface of the stage 110. In addition, the inside of the treatment container 100 is evacuated by the pump 122. The exhaust of the atmosphere in the treatment container 100 by the pump 122 is continued at least while the control illustrated in FIG. 2 is performed.

In addition, the substrate temperature is regulated so as to reach a desired treatment temperature at least before the control illustrated in FIG. 2 is started. The temperature at this time may be set to, for example, 0° C. or higher and 400° C. or lower, and may be preferably set to a temperature equal to or lower than a glass transition point (Tg) of the polymer contained as a main component among the polymers constituting the organic film to be treated. That is, when the organic film to be treated is a resist film, the temperature may be, for example, 150° C. or lower, and when the organic film to be treated is an SOC film, the temperature may be, for example, 400° C. or lower.

Figure 2B:
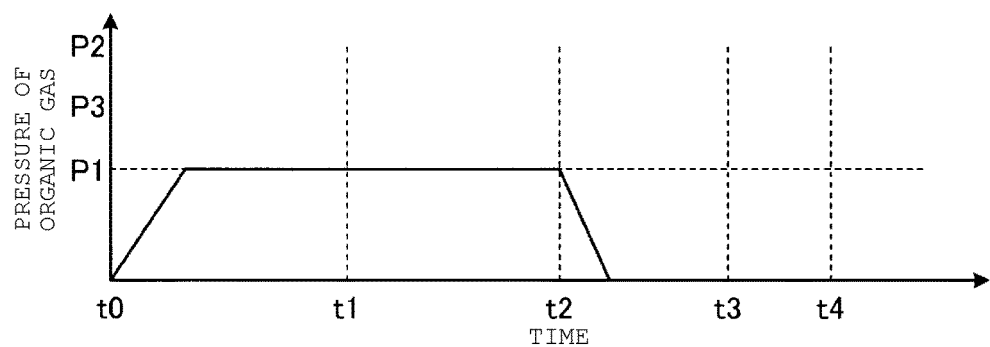
Figure 2C:
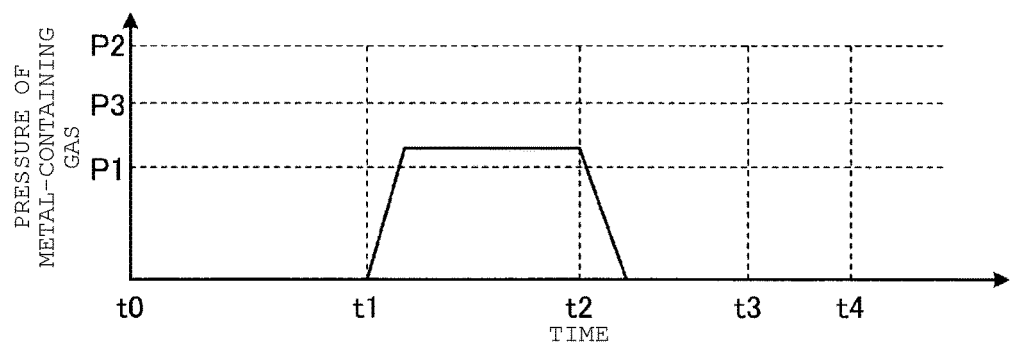
Figure 2D:
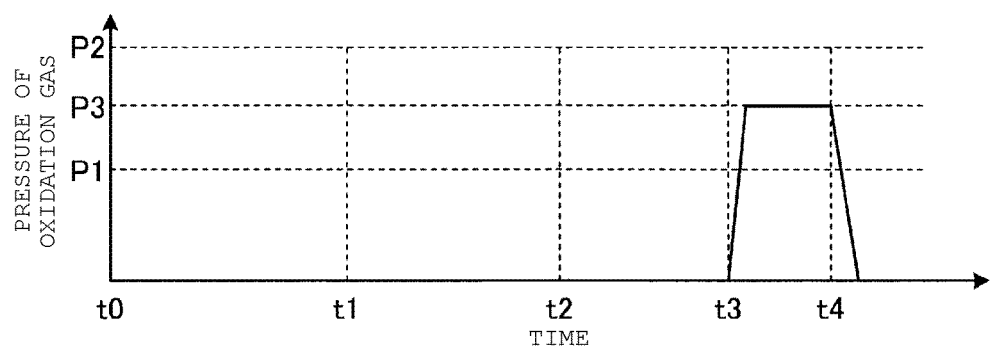

As illustrated in FIG. 2B, the valve 132v of the gas pipe 132p is opened at time t0, and the supply of the organic gas into the treatment container 100 is started. As a result, the organic gas reaches the pressure P1 after a predetermined time is elapsed from the time t0. At this time, since the gas supplied into the treatment container 100 is mainly only the organic gas, the inside of the treatment container 100 also has a pressure P1, as illustrated in FIG. 2A.

As described above, a treatment of exposing the organic film on the substrate 10 held at the predetermined temperature to the organic gas obtained by vaporizing the organic solvent is also referred to as a solvent annealing treatment.

It is noted that the pressure P1 of the organic gas in the treatment container 100 is required to be lower than the vapor pressure of the precursor so that vaporization of the precursor introduced into the treatment container 100 is not hindered by the subsequent control.

As illustrated in FIG. 2C, the valve 133v of the gas pipe 133p is opened at time t1, and the supply of the metal-containing gas into the treatment container 100 is started. As a result, the pressure of the metal-containing gas slightly exceeds the pressure P1 after a predetermined time is elapsed from the time t1. At this time, the organic gas and the metal-containing gas are supplied to the inside of the treatment container 100, and the inside of the treatment container 100 has a pressure P2 as illustrated in FIG. 2A.

As illustrated in FIG. 2B, the valve 132v of the gas pipe 132p is closed at time t2, and the supply of the organic gas into the treatment container 100 is stopped. Similarly, as illustrated in FIG. 2C, the valve 133v of the gas pipe 133p is closed at time t2, and the supply of the metal-containing gas into the treatment container 100 is stopped. As a result, as illustrated in FIG. 2A, the pressure inside the treatment container 100 decreases to a predetermined degree of vacuum, after a predetermined time is elapsed from the time t2.

As illustrated in FIG. 2D, the valve 134v of the gas pipe 134p is opened at time t3, and the supply of the oxidation gas into the treatment container 100 is started. As a result, the oxidation gas reaches the pressure P3 after a predetermined time is elapsed from the time t3. At this time, since the gas supplied into the treatment container 100 is mainly only the oxidation gas, the inside of the treatment container 100 has also a pressure P3, as illustrated in FIG. 2A.

As illustrated in FIG. 2D, the valve 134v of the gas pipe 134p is closed at time t4, and the supply of the oxidation gas into the treatment container 100 is stopped. As a result, as illustrated in FIG. 2A, the pressure inside the treatment container 100 decreases to a predetermined degree of vacuum, after a predetermined time is elapsed from the time t4.

Thereafter, the inside of the treatment container 100 is purged with an inert gas or the like, and the substrate 10 is unloaded from the inside of the treatment container 100 by the conveyance system (not illustrated).

As described above, the operation of the substrate treatment apparatus 1 of the embodiment ends.

Method of Manufacturing Semiconductor Device

Next, an example of a method of manufacturing the semiconductor device 90 of at least one embodiment will be described with reference to FIGS. 3 and 4. FIGS. 3 and 4 are cross-sectional views illustrating an example of a procedure of the method of manufacturing the semiconductor device 90 according to at least one embodiment. The method of manufacturing the semiconductor device 90 of the embodiment illustrated in FIGS. 3 and 4 includes the metal infiltration treatment by the substrate treatment apparatus 1 described above.

Figure 3A:
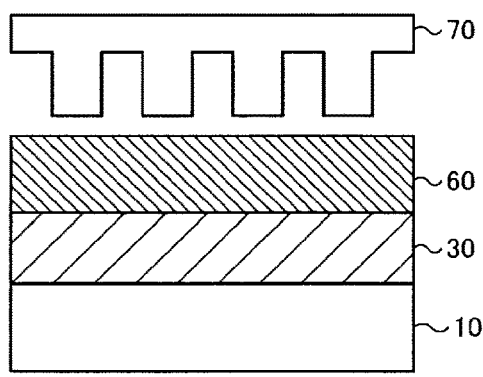
FIGS. 3A to 3G are cross-sectional views illustrating an example of a procedure of a method of manufacturing a semiconductor device according to at least one embodiment.

As illustrated in FIG. 3A, at least a $SiO_2$ film 30 as a film to be processed and a resist film 60 as an organic film are formed on the substrate 10.

The substrate 10 may be a semiconductor substrate such as a silicon substrate or another substrate such as a ceramic substrate and a glass substrate.

In the example of FIGS. 3 and 4, the resist film 60 is assumed to be a photo-curable resist film used in an imprint lithography treatment. The resist film 60 for the imprint lithography treatment is formed by dropping a liquid resist in a shot region, which is a region treated by one imprint lithography treatment, by using, for example, an ink jet method. For example, the resist film 60 may be formed by applying a resist on the entire surface of the substrate 10 by a spin coating method.

It is noted that in addition to the $SiO_2$ film 30 and the resist film 60, other structures such as transistors (not illustrated) may be formed on the substrate 10.

A template 70 for imprint lithography treatment is disposed with a surface on which the pattern is formed facing the resist film 60 formed on the substrate 10. The pattern formed on the template 70 may be a dot (projection shape) pattern for transferring holes to the $SiO_2$ film 30, a line-and-space pattern, or another pattern.

Figure 3B:
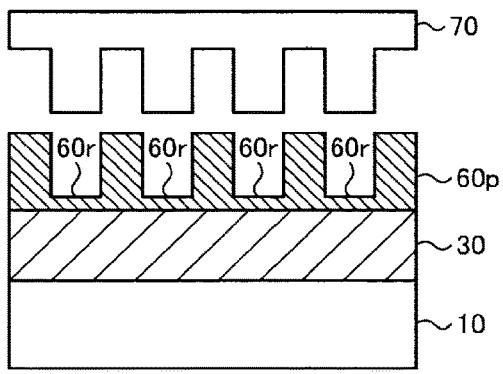

As illustrated in FIG. 3B, the pattern of the template 70 is transferred to the resist film 60 to forma resist pattern 60p. That is, the template 70 is pressed against the resist film 60 and irradiated with light such as UV light to be cured, and thereafter the template 70 is released from the resist pattern 60p.

When the template 70 is pressed against the resist film 60, a slight gap is provided between the template 70 and the $SiO_2$ film 30, which is a base film of the resist film 60, so that the template 70 does not come into contact with the substrate 10. Therefore, the resist pattern 60p has a residual resist film 60r between each pattern.

Figure 3C:
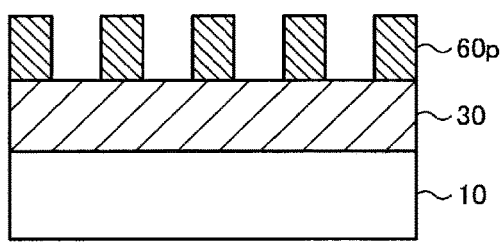

As illustrated in FIG. 3C, the residual resist film 60r of the resist pattern 60p is removed by a reactive ion etching (RIE) treatment or the like using $O_2$ plasma.

Thereafter, the substrate 10 having the resist pattern 60p is loaded into the treatment container 100 of the substrate treatment apparatus 1 described above. The substrate 10 is supported on the stage 110, and is regulated to a temperature of, for example, 0° C. or higher and 400° C. or lower, and more preferably 150° C. or lower, which is the glass transition point of the main component of the polymer contained in the resist pattern 60.

It is noted that the treatment temperature may be adjusted according to the type of precursor, the size and density of the pattern of the resist pattern 60p, and the like.

Figure 3D:
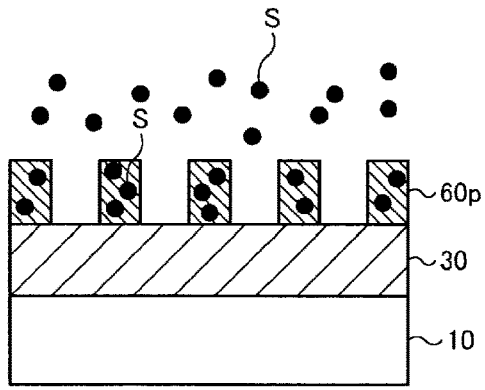

As illustrated in FIG. 3D, the organic gas containing the organic solvent molecules S is supplied to the substrate 10. As a result, the resist pattern 60p on the substrate 10 is exposed to the organic gas, and the solvent annealing treatment is performed.

By such a solvent annealing treatment, a predetermined amount of organic solvent molecules S enter into the resist pattern 60p, and the resist pattern 60p is swollen. As a result, the free energy of the polymer chains forming the resist pattern 60p is increased, and the unit structure (segment) of the polymer may be actively moved. That is, the free volume of the polymer chains forming the resist pattern 60p increases. Here, the free volume is a volume that is not occupied by the polymer in the actual volume of the polymer, and is an index of the ease of movement of the polymer chain. The free volume may be regarded as a range in which the polymer segment may move thermodynamically. In addition, by the solvent annealing treatment, it may be considered that the polymer chains forming the resist pattern 60p obtain free energy, the unit structure of the polymer may move actively, and the entangled polymer chains are in a released state.

As described above, as the free volume increases, a space not occupied by the polymer increases in the resist pattern 60p, and molecules or the like from the outside easily enter between the polymer chains forming the resist pattern 60p.

Figure 3E:
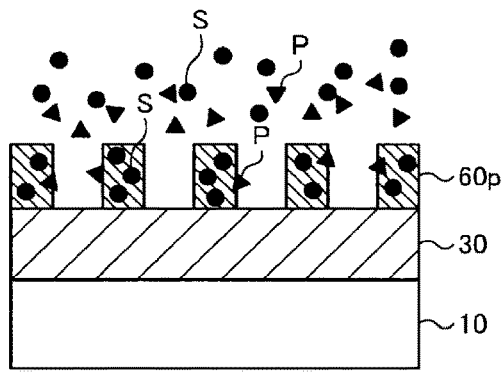

As illustrated in FIG. 3E, the metal-containing gas containing the precursor molecule P is supplied to the substrate 10 while continuing the supply of the organic gas. As a result, the resist pattern 60p on the substrate 10 is exposed to the metal-containing gas.

Due to the above-described solvent annealing treatment, molecules from the outside easily enter the resist pattern 60p. Therefore, a predetermined amount of the precursor molecule P enters into the resist pattern 60p exposed to the metal-containing gas.

At this time, it is preferable that the substrate 10 is allowed to stand for 1 minute to 120 minutes so that the precursor molecules P permeate into the entire resist pattern 60p. The standing time of the substrate 10 may be adjusted according to the type of the precursor molecule P, the size and density of the pattern of the resist pattern 60p, and the like.

It is noted that infiltration of the precursor molecule P into the resist pattern 60p is considered to occur as follows. As described above, the resist pattern 60p contains, for example, a polymer of acrylic acid ester or a copolymer of acrylic acid ester and methacrylic acid ester as a main component. In addition, precursors such as TMA are strong Lewis acids. Therefore, the metal atom in the precursor is easily coordinated with the unshared electron pair of the oxygen atom of the carbonyl group in the acrylic acid ester or the methacrylic acid ester. As described above, a state where the metal atom is coordinated with the predetermined structure of the polymer chain forming the resist pattern 60p is a state where the precursor molecule P is infiltrated in the resist pattern 60p.

However, at this stage, the metal element in the precursor molecule P is not fixed in the resist pattern 60p.

Figure 3F:
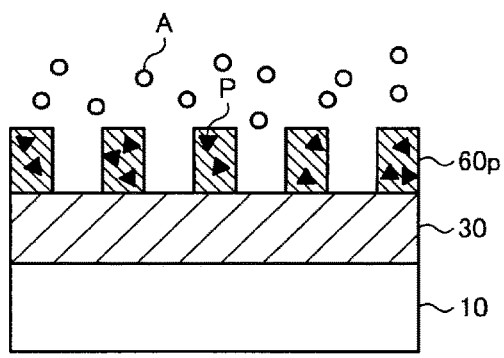

As illustrated in FIG. 3F, the oxidation gas containing the oxidizing agent molecule A is supplied to the substrate 10.

Figure 3G:
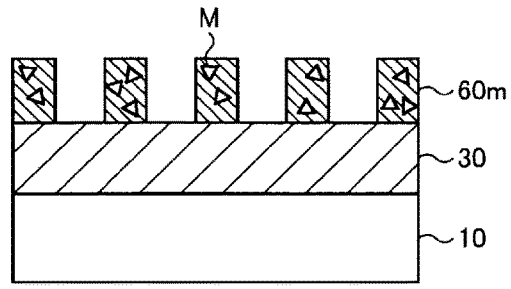

As illustrated in FIG. 3G, the resist pattern 60p on the substrate 10 is treated with the oxidizing agent molecule A in the oxidation gas, and each metal M or a metal compound M such as a metal oxide is deposited in the resist pattern 60p from the precursor molecule P infiltrated in the resist pattern 60p. As a result, the metal element is fixed in the resist pattern 60p, and the resist pattern 60m infiltrated with the metal is formed.

It is noted that the metal element infiltrated in the resist pattern 60m may be present in the resist pattern 60m with a uniform concentration distribution, or may be present with a non-uniform concentration distribution.

Figure 4A:
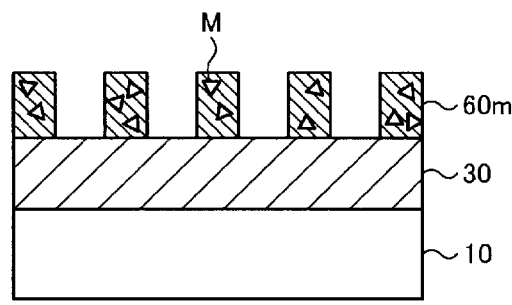
FIGS. 4A to 4C are cross-sectional views illustrating an example of the procedure of the method of manufacturing the semiconductor device according to at least one embodiment.

Similar to FIG. 3G, FIG. 4A illustrates the substrate 10 having the resist pattern 60m infiltrated with metal.

Figure 4B:
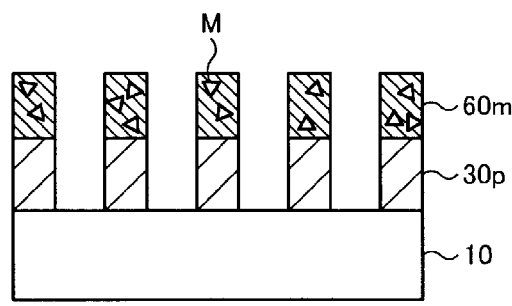

As illustrated in FIG. 4B, the $SiO_2$ film 30 is etched using the resist pattern 60m as a mask.

Figure 4C:
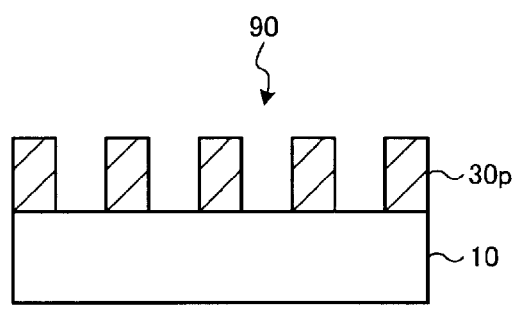

As illustrated in FIG. 4C, the semiconductor device 90 is obtained by removing the resist pattern 60m.

It is noted that in addition to the treatments illustrated in FIGS. 3 and 4, the treatment of forming and patterning various films to be processed may be repeated.

As described above, the method of manufacturing the semiconductor device 90 of the embodiment ends.

Pattern Formation Method

Next, with reference to FIG. 5, an example of a pattern formation method using the substrate treatment apparatus 1 of at least one embodiment will be described. FIG. 5 is a flowchart illustrating an example of a procedure of the pattern formation method by the substrate treatment apparatus 1 according to at least one embodiment.

As illustrated in FIG. 5, the controller 140 of the substrate treatment apparatus 1 controls the conveyance system (not illustrated) to load the substrate 10 on which an organic film pattern such as a resist pattern is formed into the treatment container 100 (Step S101).

The inside of the treatment container 100 is purged with an inert gas (Step S102). That is, the controller 140 opens the valve 131v of the gas pipe 131p and supplies the inert gas into the treatment container 100. As a result, the atmosphere in the treatment container 100 is replaced with the inert gas.

After closing the valve 131v of the gas pipe 131p, the controller 140 operates the pump 122 to evacuate the atmosphere in the treatment container 100 to a vacuum (Step S103).

It is noted that at the treatment timing of Step S102 or Step S103, the controller 140 regulates the temperature of the stage 110 supporting the substrate 10 so that the temperature of the substrate 10 is a desired treatment temperature equal to or lower than the glass transition point.

The reason why the temperature of the stage 110 is not regulated before the substrate 10 is loaded is to prevent the organic film pattern from being heated by the atmospheric pressure atmosphere and being damaged by oxidation or the like, for example, when the desired treatment temperature is relatively high.

The controller 140 opens the valve 132v of the gas pipe 132p and starts the supply of the organic gas into the treatment container 100 (Step S104). As a result, the organic film pattern on the substrate 10 is exposed to the organic gas, and the free volume of the organic film pattern increases.

The controller 140 opens the valve 133v of the gas pipe 133p and starts the supply of the metal-containing gas into the treatment container 100 (Step S105). As a result, the organic film pattern on the substrate 10 is exposed to the metal-containing gas, and the precursor containing metal in the metal-containing gas infiltrates the organic film pattern.

After a lapse of a predetermined time, the controller 140 closes the valve 132v of the gas pipe 132p to stop the supply of the organic gas into the treatment container 100. In addition, the controller 140 closes the valve 133v of the gas pipe 133p to stop the supply of the metal-containing gas into the treatment container 100 (Step S106).

The controller 140 continues evacuation of the atmosphere inside the treatment container 100 by the pump 122 for a predetermined time to evacuate the inside of the treatment container 100 (Step S107). As a result, the organic gas and the metal-containing gas remaining in the treatment container 100 are discharged to the outside of the treatment container 100.

The controller 140 opens the valve 134v of the gas pipe 134p to supply the oxidation gas into the treatment container 100 (Step S108). As a result, the organic film pattern on the substrate 10 is treated with the oxidizing agent in the oxidation gas, and each metal or the metal compound is deposited in the organic film pattern from the precursor infiltrated in the organic film pattern. Thereafter, the controller 140 closes the valve 134v of the gas pipe 134p.

The controller 140 continues evacuation of the atmosphere inside the treatment container 100 by the pump 122 for a predetermined time to evacuate the inside of the treatment container 100 (Step S109). As a result, the oxidation gas remaining in the treatment container 100 is discharged to the outside of the treatment container 100.

The inside of the treatment container 100 is purged with an inert gas (Step S110). That is, the controller 140 stops the pump 122, opens the valve 131v of the gas pipe 131p, and supplies the inert gas into the treatment container 100. As a result, the atmosphere in the treatment container 100 is replaced with the inert gas.

The controller 140 controls the conveyance system (not illustrated) to unload the substrate 10 having the organic film pattern subjected to the metal infiltration treatment from the inside of the treatment container 100, which is at atmospheric pressure (Step S111).

It is noted that when the treatment temperature of the substrate 10 is the predetermined temperature or higher, after the treatment of Step S109, it is preferable to cool the substrate 10 at least before the inside of the treatment container 100 is atmospheric pressure. The controller 140 cools the substrate 10 by stopping the heating of the substrate 10 by the temperature regulating mechanism 111 of the stage 110 or by lowering the temperature of the upper surface of the stage 110 by the temperature regulating mechanism 111.

As described above, the pattern formation method using the substrate treatment apparatus 1 of the embodiment ends.

Summary

With high integration of semiconductor devices such as three-dimensional nonvolatile memory, pattern formation with a high degree of difficulty such as an aspect ratio of 50 or more may be performed in dry etching treatment or the like, and development of a mask material excellent in etching resistance is required.

When an organic film is used as a mask material, as one of methods for improving etching resistance, a treatment of introducing a metal or a metal compound into an organic film by permeating an organic or inorganic precursor molecule containing a metal into the organic film is studied.

For example, in the technique of the Patent Document 1 (U.S. Pat. No. 8,980,418) described above, a precursor gas containing a metal is permeated into a resin such as a photoresist, and a metal or a metal compound is introduced into the resin by a thermal oxidation treatment.

However, when the film density of the organic film is high due to high crosslink density, diffusion of precursor molecules into the organic film may be hindered. In addition, even when the size of the precursor molecule is large, diffusion into the organic film may be hindered.

For example, it is known that increasing the treatment temperature of the above-described metal infiltration treatment promotes diffusion of precursor molecules into the organic film. However, in this case, in order to prevent thermal decomposition damage to the polymer chains in the organic film, it is not possible to raise the temperature to the decomposition temperature or higher, and further it is desirable to keep the treatment temperature equal to or lower than the process temperature (thermal history temperature) that the semiconductor device has until then. Therefore, it may be difficult to sufficiently diffuse the precursor molecules into the organic film by the treatment by increasing the temperature.

For example, in the technique of the above-described Patent Document 2 (U.S. patent Ser. No. 10/395,899), the metal infiltration treatment is performed using plasma treatment under a low temperature condition. Although this method is effective, this method has a disadvantage that the device cost increases in practical use.

As a result of earnest research, the present inventors found that it is possible to improve the infiltration concentration of the precursor molecule in the organic film even under the low temperature conditions by performing the solvent annealing treatment with the organic solvent, before introducing the precursor molecule into the organic film. According to the present inventors, by the solvent annealing treatment, the polymer chains in the organic film obtain free energy, and the free volume of the polymer chains increases. That is, it is considered that the precursor molecule is easily introduced from the outside into the organic film by expanding the space not occupied by the polymer.

According to the pattern formation method of at least one embodiment, the organic film is exposed to the organic gas, and the organic film is exposed to the metal-containing gas. As a result, the amount of metal infiltrated into the organic film may be increased even under the low temperature condition.

In addition, as a result, the amount of infiltration of the precursor molecule may be increased even for an organic film having a high film density due to a high crosslink density. According to the above technique, even a precursor molecule that can enter only an organic film having a crosslink density of less than 1.2 g/cm$^3$ may be infiltrated into an organic film having a crosslink density of 1.3 g/cm$^3$ or more.

In addition, as a result, even a precursor molecule having a large molecular size such as TDMAT, TDMAH, and TDMAZ may be infiltrated into the organic film.

As described above, the etching resistance of the organic film may be improved.

According to the pattern formation method of the embodiment, for example, when the vapor pressure of the precursor is low, the precursor and a vaporized gas of an organic solvent that dissolves the precursor is used as the metal-containing gas. As a result, the precursor and the organic solvent may be supplied, and the function of the solvent annealing treatment using the organic solvent may be further enhanced. In addition, even when the vapor pressure of the precursor is low, the precursor may be easily vaporized and supplied to the organic film.

Modification Example

Next, a pattern formation method according to a modification example of at least one embodiment will be described with reference to FIGS. 6 to 8. The pattern formation method of the modification example is different from the above-described at least one embodiment in that the organic gas and the metal-containing gas are supplied at the same timing. The pattern formation method of the modification example is also performed by using the substrate treatment apparatus 1 of the above-described embodiment and different control methods.

FIG. 6 are timing charts illustrating a timing of gas supply and pressure control in a substrate treatment apparatus according to the modification example of at least one embodiment.

Prior to the control of FIG. 6, the substrate having the organic film is loaded into the treatment container 100 of the substrate treatment apparatus 1, supported on the stage 110, and is regulated to a temperature of, for example, 0° C. or higher and 400° C. or lower, and more preferably a temperature equal to or lower than the glass transition point of the polymer serving as the main component among the polymers contained in the organic film.

Figure 6A:
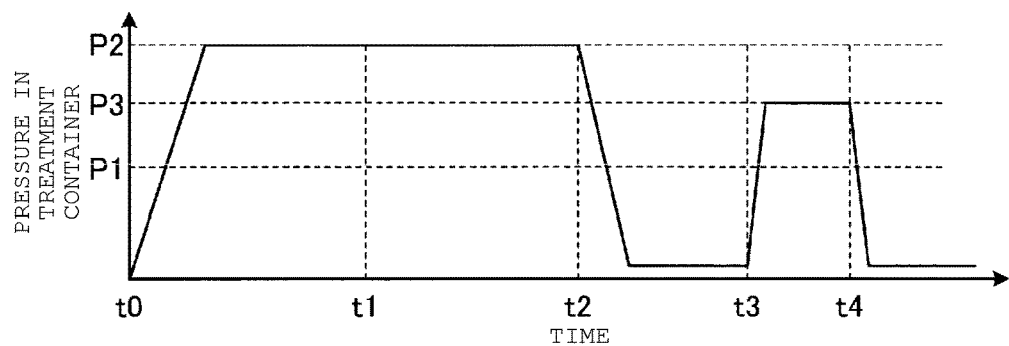
FIGS. 6A to 6D are timing charts illustrating a timing of gas supply and pressure control in a substrate treatment apparatus according to a modification example of at least one embodiment.
Figure 6B:
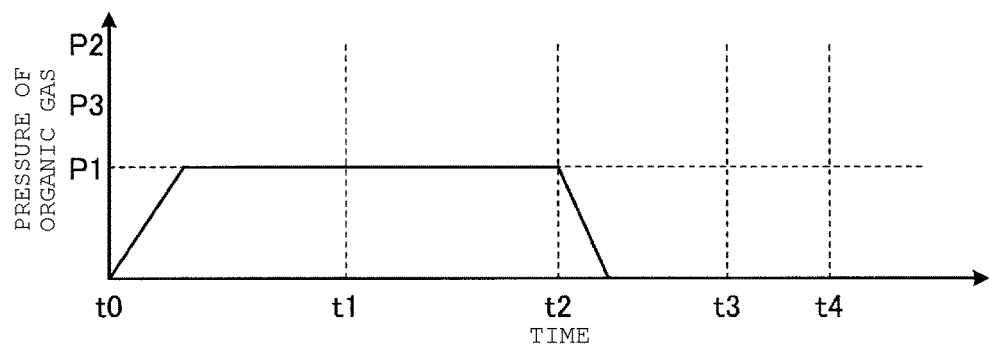

As illustrated in FIG. 6B, the valve 132v of the gas pipe 132p is opened at time t0, and the supply of the organic gas into the treatment container 100 is started. As a result, the organic gas reaches the pressure P1 after a predetermined time is elapsed from the time t0.

Figure 6C:
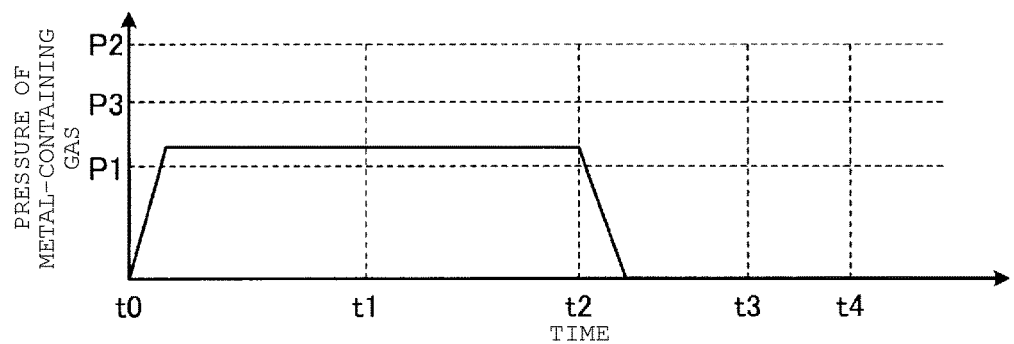

As illustrated in FIG. 6C, the valve 133v of the gas pipe 133p is opened at time t0, and the supply of the metal-containing gas into the treatment container 100 is started. As a result, the pressure of the metal-containing gas slightly exceeds the pressure P1 after a predetermined time is elapsed from the time t1.

As described above, the organic gas and the metal-containing gas are supplied into the treatment container 100, and the inside of the treatment container 100 has a pressure P2 as illustrated in FIG. 6A.

As illustrated in FIG. 6B, the valve 132v of the gas pipe 132p is closed at time t2 when time t1 is elapsed from time t0, and the supply of the organic gas into the treatment container 100 is stopped. Similarly, as illustrated in FIG. 6C, the valve 133v of the gas pipe 133p is closed at time t2, and the supply of the metal-containing gas into the treatment container 100 is stopped. As a result, as illustrated in FIG. 6A, the pressure inside the treatment container 100 decreases to a predetermined degree of vacuum, after a predetermined time is elapsed from the time t2.

Figure 6D:
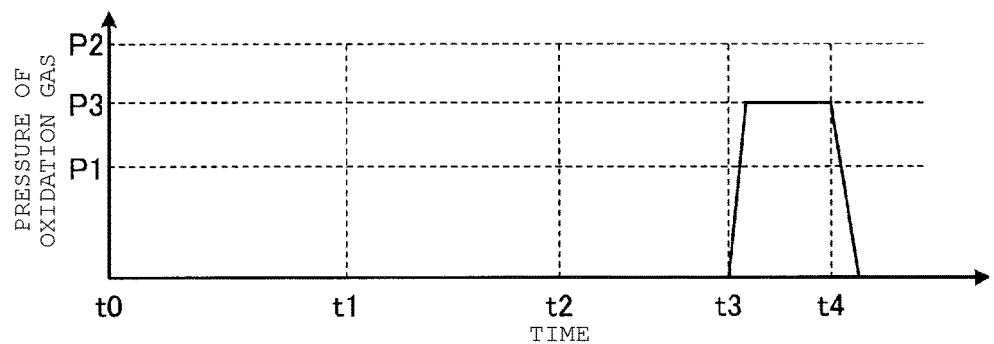

As illustrated in FIG. 6D, the valve 134v of the gas pipe 134p is opened at time t3, and the supply of the oxidation gas into the treatment container 100 is started. As a result, the oxidation gas reaches the pressure P3 after a predetermined time is elapsed from the time t3. At this time, since the gas supplied into the treatment container 100 is mainly only the oxidation gas, the inside of the treatment container 100 also has a pressure P3, as illustrated in FIG. 6A.

As illustrated in FIG. 6D, the valve 134v of the gas pipe 134p is closed at time t4, and the supply of the oxidation gas into the treatment container 100 is stopped. As a result, as illustrated in FIG. 6A, the pressure inside the treatment container 100 decreases to a predetermined degree of vacuum, after a predetermined time is elapsed from the time t4.

Thereafter, the inside of the treatment container 100 is purged with an inert gas or the like, and the substrate 10 is unloaded from the inside of the treatment container 100 by the conveyance system (not illustrated).

As described above, the operation of the substrate treatment apparatus 1 of the modification example ends.

FIG. 7 are cross-sectional views illustrating an example of a procedure of a method of manufacturing a semiconductor device according to the modification example of the embodiment.

Prior to the treatment illustrated in FIG. 7, the SiO$_2$ film 30 and the resist film 60 are formed on the substrate 10 through the same treatment as that in FIGS. 3A to 3C of the above-described embodiment, and a resist pattern 60p having a pattern in which the residual resist film is removed from the resist film 60 is formed by the imprint lithography method and the subsequent RIE treatment.

Figure 7A:
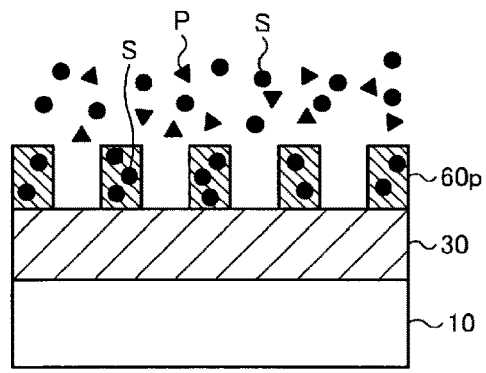
FIGS. 7A to 7D are cross-sectional views illustrating an example of a procedure of a method of manufacturing a semiconductor device according to the modification example of at least one embodiment.

As illustrated in FIG. 7A, the organic gas containing the organic solvent molecule S and the metal-containing gas containing the precursor molecule P are supplied to the substrate 10. As a result, the resist pattern 60p on the substrate 10 is exposed to the organic gas and also to the metal-containing gas.

In this case, it is considered that the organic solvent molecule S enters the resist pattern 60p due to the action of the solvent annealing treatment. As a result, the free volume of the polymer chains in the resist pattern 60p increases, and molecules from the outside are easily infiltrated.

Figure 7B:
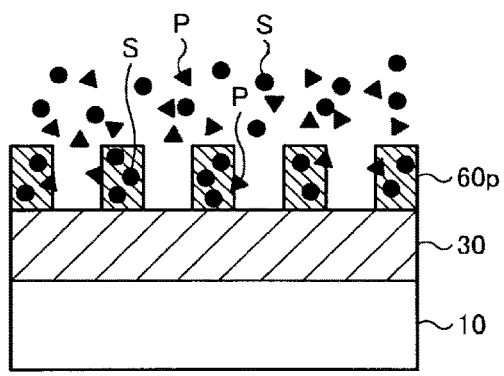

As illustrated in FIG. 7B, when the free volume of the polymer chains in the resist pattern 60p is increased by the solvent annealing treatment, the precursor molecules P contained in the metal-containing gas are infiltrated.

Figure 7C:
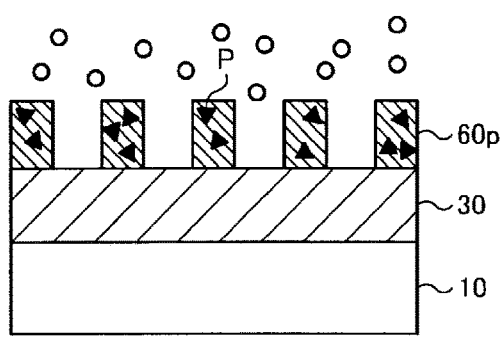

As illustrated in FIG. 7C, the oxidation gas containing the oxidizing agent molecule A is supplied to the substrate 10.

Figure 7D:
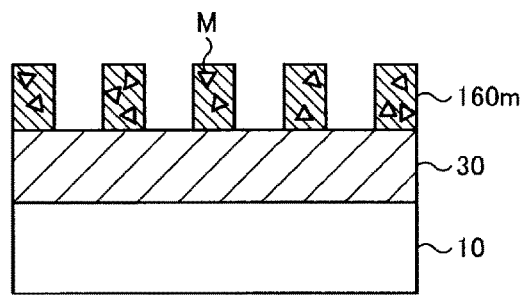

As illustrated in FIG. 7D, from the precursor molecule P treated with the oxidizing agent molecule A in the oxidation gas and infiltrated in the resist pattern 60p, each metal M or the metal compound M such as a metal oxide is deposited in the resist pattern 60p, and a resist pattern 160m infiltrated with the metal is formed.

As described above, by starting the supply of the organic gas and the metal-containing gas to the substrate 10 at the same timing, the resist pattern 160m infiltrated with the metal is obtained, similar to the above-described embodiment.

Thereafter, the semiconductor device of the modification example is manufactured through the same treatments as those in FIGS. 4A to 4C of the above-described embodiment.

As described above, the method of manufacturing the semiconductor device of the modification example ends.

FIG. 8 is a flowchart illustrating an example of a procedure of a pattern formation method by the substrate treatment apparatus 1 according to the modification example of at least one embodiment.

The treatments of Steps S201 to S203 illustrated in FIG. are the same as the treatments of Steps S101 to S103 illustrated in FIG. 5 of the above at least one embodiment. That is, the substrate 10 on which the organic film pattern is formed is loaded into the treatment container 100 (Step S201), the inside of the treatment container 100 is purged with an inert gas (Step S202), and the substrate is evacuated to a vacuum (Step S203). During this time, the temperature of the substrate 10 is regulated to the desired treatment temperature.

Next, the controller 140 opens the valve 132v of the gas pipe 132p and starts the supply of the organic gas into the treatment container 100. In addition, at the same timing as this, the controller 140 opens the valve 133v of the gas pipe 133p and starts the supply of the metal-containing gas into the treatment container 100 (Step S204).

The treatments of Steps S206 to S211 illustrated in FIG. 8 is the same as the treatments of Steps S106 to S111 illustrated in FIG. 5 of the above at least one embodiment. That is, the supply of the organic gas and the metal-containing gas into the treatment container 100 is stopped (Step S206), and the oxidation gas is supplied into the treatment container 100 (Step S208) after the treatment container 100 is evacuated (Step S207). The inside of the treatment container 100 is evacuated (Step S209) and purged with an inert gas (Step S210), and the substrate 10 on which the metal infiltration treatment is performed is unloaded from the treatment container 100 (Step S211). During this time, the substrate 10 is cooled.

As described above, the pattern formation method using the substrate treatment apparatus 1 of the modification example ends.

According to the pattern formation method of the modification example, the same effect as that of the above-described embodiment is obtained.

EXAMPLE

Hereinafter, examples will be described in detail with reference to the drawings.

Example 1

As Example 1, a treatment of infiltrating a resist film patterned by an ArF liquid immersion exposure method with aluminum was performed. In addition, as Comparative Example 1, the same treatment was performed under the low temperature condition without performing the solvent annealing treatment, and as Comparative Example 2, the same treatment was performed under the high temperature condition without performing the solvent annealing treatment.

FIGS. 9 and 10 are cross-sectional views illustrating procedures of methods of preparing samples according to Example 1 and Comparative Examples 1 and 2.

Figure 9A:
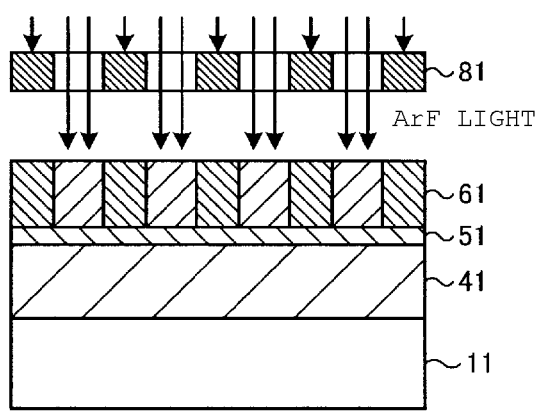
FIGS. 9A and 9B are cross-sectional views illustrating procedures of methods of preparing samples according to Example 1 and Comparative Examples 1 and 2.

As illustrated in FIG. 9A, in order to prepare the samples of Example 1 and Comparative Examples 1 and 2, an SOC film 41 was formed on the substrate 11 to a thickness of 300 nm by the spin coating method, and an spin-on-glass (SOG) film 51 was formed on the SOC film 41 to a thickness of 40 nm by the spin coating method. The SOG film 51 is a $SiO_2$ film formed by the spin coating method. A positive resist film 61 was formed on the SOG film 51 to a thickness of 100 nm by the spin coating method.

A reticle 81 was opposed to the resist film 61 on the substrate 11, and a hole pattern of the reticle 81 was transferred by an liquid immersion exposure method using ArF excimer laser as exposure light.

Figure 9B:
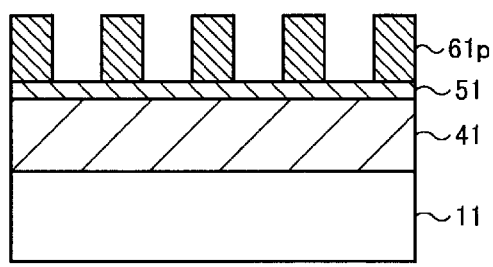

As illustrated in FIG. 9B, a resist pattern 61p having the hole pattern was formed on the substrate 11.

In order to perform the metal infiltration treatment on the sample of Example 1, the substrate 11 having the resist pattern 61p formed thereon was loaded into the treatment container of the substrate treatment apparatus, and the inside of the treatment container was temporarily depressurized to 10 Pa. The temperature of the substrate 11 was raised to 50° C.

Figure 10A:
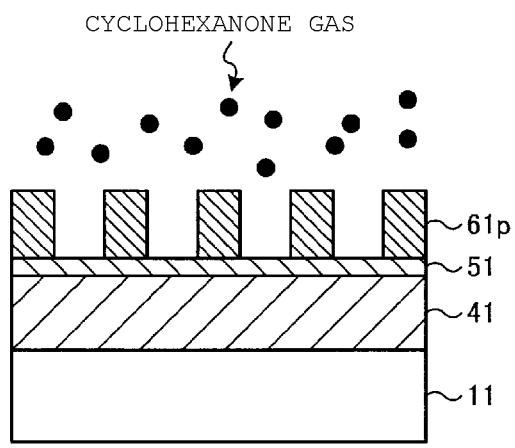
FIGS. 10A to 10E are cross-sectional views illustrating procedures of methods of preparing the samples according to Example 1 and Comparative Examples 1 and 2.

As illustrated in FIG. 10A, at the treatment temperature of 50° C., cyclohexanone gas was supplied into the treatment container to regulate the pressure to 100 Pa, and the substrate 11 was held for 3 minutes.

Figure 10B:
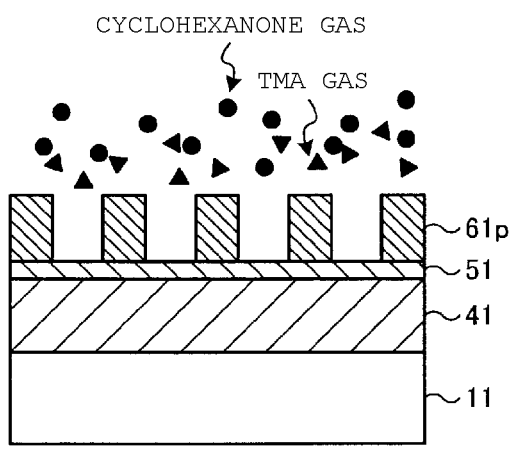

As illustrated in FIG. 10B, TMA gas was supplied into the treatment container while maintaining the treatment temperature at 50° C., and the cyclohexanone gas pressure/TMA gas pressure was regulated to 100 Pa/100 Pa. As a result, the total pressure in the treatment container is 200 Pa. In this state, the substrate 11 was held for 5 minutes. The pressure in the treatment container was depressurized to 10 Pa, and the cyclohexanone gas and TMA gas remaining in the treatment container were discharged.

Figure 10D:
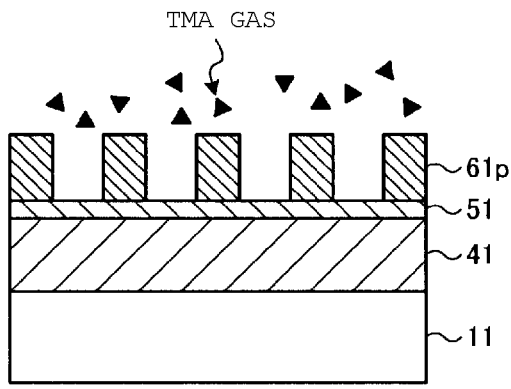
Figure 10C:
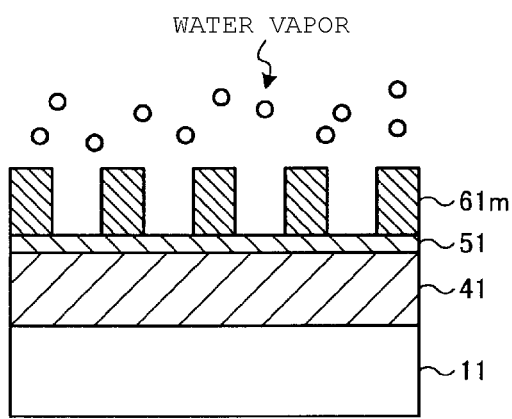

As illustrated in FIG. 10C, while maintaining the treatment temperature at 50° C., water vapor was supplied into the treatment container to regulate the pressure to 250 Pa, and the substrate 11 was held for 3 minutes. Thereafter, the pressure in the treatment container was depressurized to 10 Pa, and the water vapor remaining in the treatment container was discharged.

Thereafter, the substrate 11 was cooled while purging the inside of the treatment container with nitrogen gas to return to the atmospheric pressure. As described above, the resist pattern 61m of Example 1 was obtained.

Figure 10E:
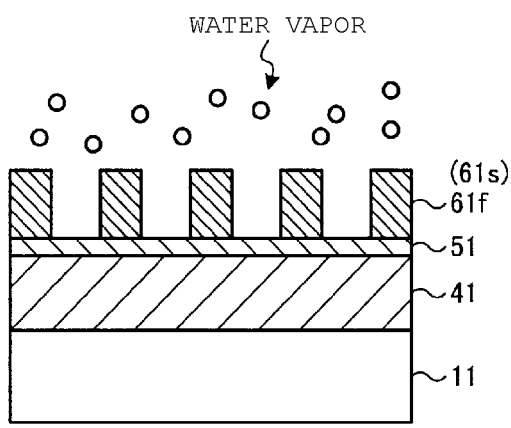

On the other hand, in order to perform the metal infiltration treatment on the samples of Comparative Examples 1 and 2, the substrate 11 subjected to the treatment up to FIG. 9B was subjected to the treatments of FIGS. 10D and 10E. At this time, the sample of Comparative Example 1 was treated in the same manner as the sample of Example 1 except that the cyclohexanone gas was not supplied. In addition, the sample of Comparative Example 2 was treated in the same manner as the sample of Example 1 except that the cyclohexanone gas was not supplied and the treatment temperature was 100° C.

That is, as illustrated in FIG. 10D, the substrate 11 was exposed to TMA gas for 5 minutes at a pressure of 100 Pa. After the pressure was temporarily depressurized to 10 Pa, the substrate 11 was treated with water vapor for 3 minutes at a pressure of 250 Pa as illustrated in FIG. 10E. After depressurizing the pressure to 10 Pa again, the substrate 11 was cooled while purging the inside of the treatment container with nitrogen gas to return to atmospheric pressure. As described above, the resist pattern 61f of Comparative Example 1 and the resist pattern 61s of Comparative Example 2 were obtained.

When a cross section of the resist pattern 61m of Example 1 was observed by a transmission electron microscopy (TEM), and a composition analysis was performed by the energy dispersive X-ray spectroscopy (EDX), approximately 15 at % of Al atoms were confirmed in the plane of the resist pattern 61m.

When a cross section of the resist pattern 61f of Comparative Example 1 was observed by TEM and a composition analysis was performed by EDX, Al atoms were segregated only in a surface layer portion of the resist pattern 61f, and approximately 10 at % of Al atoms were measured. As described above, it was found that when the metal infiltration treatment was performed under the low temperature condition without performing the solvent annealing treatment, the amount of Al atoms infiltrated into the resist pattern 61f is reduced and the concentration distribution is significantly deviated.

When a cross section of the resist pattern 61s of Comparative Example 2 was observed by TEM and a composition analysis was performed by EDX, approximately 15 at % of Al atoms were measured in the film of the resist pattern 61s. As a result, it was found that the resist pattern 61m of Example 1 subjected to the metal infiltration treatment under the low temperature condition was infiltrated with Al atoms equivalent to those of the resist pattern 61s of Comparative Example 2 subjected to the metal infiltration treatment under the high temperature condition.

Subsequently, the metal infiltration treatment was performed without patterning the resist film of the same type as the above sample.

The resist film subjected to the treatment illustrated in FIGS. 10A to 10C was used as a sample of Example 1 in the same manner as above. In addition, the resist film subjected to the treatments of FIGS. 10D and 10E at the same treatment temperature as that of the sample of Example 1, that is, at 50° C. was used as a sample of Comparative Example 1. The resist film subjected to the treatments of FIGS. 10D and 10E under the high temperature condition, that is, 100° C. was used as a sample of Comparative Example 2.

When a composition analysis in the film depth direction was performed on the resist film of Example 1 by X-ray photoelectron spectroscopy (XPS), Al atoms were measured at a concentration of approximately 17 at % in the resist film, and a resist film in which Al atoms were introduced into the entire resist film was obtained.

When a composition analysis in the film depth direction was performed on the resist film of Comparative Example 1 by XPS, Al atoms were measured at a concentration of approximately 10 at % in the surface layer portion of the resist film, and were not measured at a depth of approximately 80 nm. Al atoms could not be measured even on the surface side of the substrate. From this result, it is found that when the metal infiltration treatment is performed under the low temperature condition without performing the solvent annealing treatment, a sufficient infiltration concentration is not obtained.

When a composition analysis in the film depth direction was performed on the resist film of Comparative Example 2 by XPS, Al atoms were measured from the vicinity of the surface of the resist film to the substrate side, and Al atoms were measured at a concentration of 17 at % on the surface side and 15 at % on the substrate side of the resist film. Also from this result, it is found that the resist film of Example 1 subjected to the metal infiltration treatment under the low temperature condition was infiltrated with the same Al atoms as the resist film of Comparative Example 2 subjected to the metal infiltration treatment under the high temperature condition.

Example 2

As Example 2, a treatment of infiltrating a resist film patterned by an imprint lithography technique with aluminum was performed. FIG. 11 are cross-sectional views illustrating a procedure of a method of preparing a sample according to Example 2.

Figure 11A:
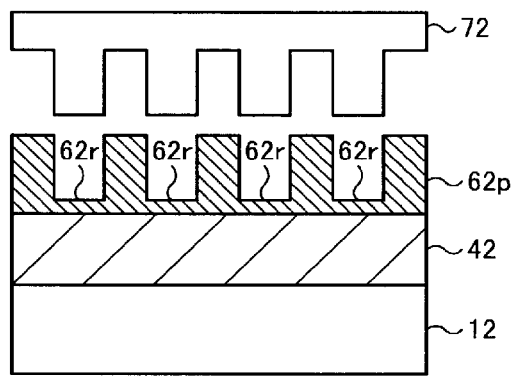
FIGS. 11A to 11D are cross-sectional views illustrating a procedure of a method of preparing a sample according to Example 2.

As illustrated in FIG. 11A, an SOC film 42 was formed on the substrate 12 to a thickness of 200 nm by a spin coating method, and a photocurable resist film was formed on the SOC film 42 to a predetermined thickness. The resist film was formed by ejecting a liquid resist onto the SOC film 42 of the substrate 12 by an ink jet method.

The template 72 for imprint lithography treatment was pressed against the resist film and cured by UV light irradiation, the line and space pattern of the template 72 was transferred, and a resist pattern 62p having a residual resist film 62r between the patterns was formed. The height difference between the line and space of the resist pattern 62p was 40 nm, and the half pitch was 20 nm.

Figure 11B:
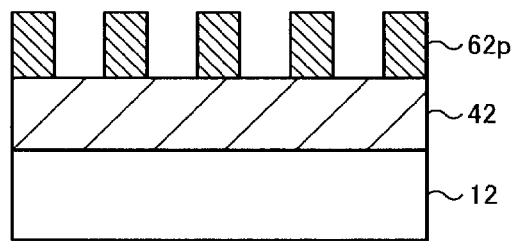

As illustrated in FIG. 11B, the residual resist film 62r of the resist pattern 62p was removed by RIE treatment using $O_2$ plasma. As a result, the SOC film 42 was exposed to a space portion of the resist pattern 62p. In addition, the height difference between the line and space in the resist pattern 62p was reduced to 30 nm by this treatment.

Thereafter, the substrate 12 on which the resist pattern 62p was formed was loaded into the treatment container of the substrate treatment apparatus. After temporarily depressurizing the inside of the treatment container to 10 Pa, nitrogen gas was supplied into the treatment container and the temperature of the substrate 12 was raised to 100° C. so that the resist pattern 62p had an appropriate treatment temperature.

Figure 11C:
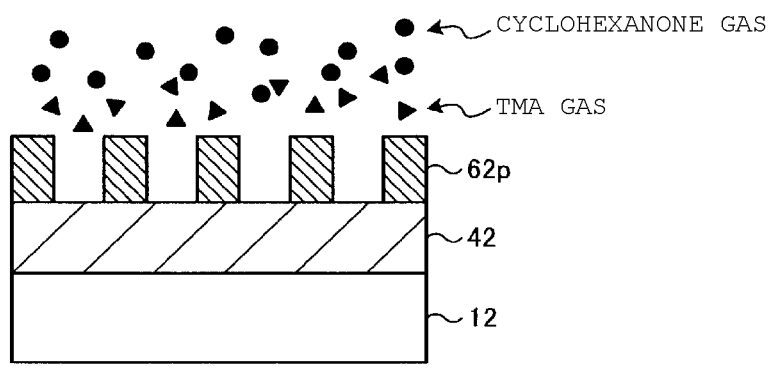

As illustrated in FIG. 11C, at a treatment temperature of 100° C., cyclohexanone gas was supplied into the treatment container to regulate the pressure to 100 Pa. In addition, the TMA gas was supplied into the treatment container so that the total pressure was regulated to 200 Pa, and the substrate 12 was held for 5 minutes. Thereafter, the pressure in the treatment container was depressurized to 10 Pa, and the cyclohexanone gas and TMA gas remaining in the treatment container were discharged.

Figure 11D:
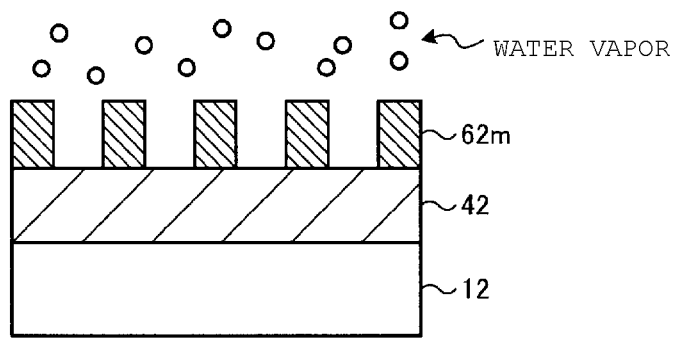

As illustrated in FIG. 11D, while maintaining the treatment temperature at 100° C., water vapor was supplied into the treatment container to regulate the pressure to 250 Pa, and the substrate 12 was held for 5 minutes. Thereafter, the pressure in the treatment container was depressurized to 10 Pa, and the water vapor remaining in the treatment container was discharged. As described above, the resist pattern 62m of Example 2 was obtained.

When a cross section of the resist pattern 62m of Example 2 was observed by TEM and a composition analysis was performed by EDX, Al atoms were segregated only in the surface layer portion of the resist pattern 62m, and approximately 20 at % of Al atoms were measured.

As described above, it was found that the resist pattern 62m for imprint lithography may also be infiltrated with Al atoms with a high concentration, similar to the resist pattern 61m for ArF liquid immersion exposure of Example 1.

In addition, even when the supply of the cyclohexanone gas as an organic gas and the supply of the TMA gas as a metal-containing gas are started at the same timing as in Example 2, it was found that the resist pattern 62m may be infiltrated with Al atoms with a high concentration.

Subsequently, the resist film of Example 2 was obtained by performing the metal infiltration treatment illustrated in FIGS. 11C and 11D under the same conditions as those of Example 2 described above without patterning the resist film of the same type as the above sample.

When a composition analysis in the film depth direction was performed on the resist film of Example 2 by XPS, approximately 20 at % Al atoms were measured from the surface layer portion of the resist film to the substrate surface. From this result, it is found that a resist film for imprint lithography may be infiltrated with Al atoms with a high concentration, and even when cyclohexanone gas and TMA gas are simultaneously supplied, the Al atoms may be infiltrated in high concentration.

Example 3

As Example 3, a treatment of infiltrating the SOC film to which the resist pattern was transferred with aluminum was performed. In addition, as Comparative Example 3, the same treatment was performed at the same treatment temperature as that of Example 3 without performing the solvent annealing treatment.

FIGS. 12 and 13 are cross-sectional views illustrating procedures of methods of preparing samples according to Example 3 and Comparative Example 3.

Figure 12A:
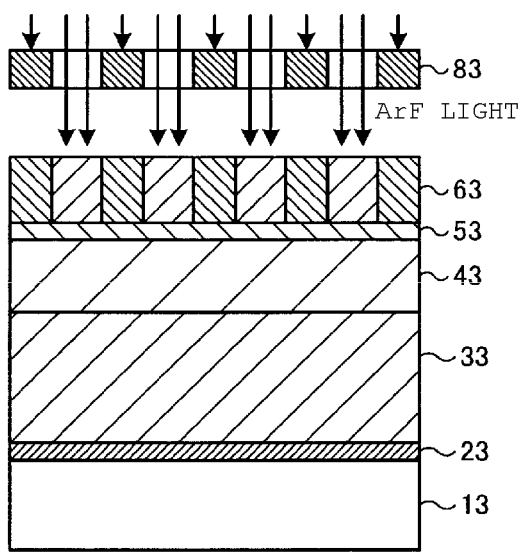
FIGS. 12A to 12D are cross-sectional views illustrating procedures of methods of preparing samples according to Example 3 and Comparative example 3.

As illustrated in FIG. 12A, in order to prepare the samples of Example 3 and Comparative Example 3, a tungsten film 23 was formed on the substrate 13 to have a thickness of 50 nm, and a $SiO_2$ film 33 was formed on the tungsten film 23 to a thickness of 1000 nm.

In addition, an SOC film 43 was formed on the $SiO_2$ film 33 to a thickness of 300 nm by the spin coating method. The post bake temperature at this time was 250° C. The SOC film 43 used here is made of a material having an acrylic resin or a methacrylic resin as a main component and having an ester bond. Therefore, it is considered that the SOC film 43 may also be infiltrated with a metal such as aluminum, when an appropriate metal infiltration treatment is performed.

The SOG film 53 was formed on the SOC film 43 to a thickness of 40 nm by the spin coating method, and the positive resist film 63 was formed on the SOG film 53 to a thickness of 100 nm by the spin coating method.

A reticle 83 was opposed to the resist film 63 on the substrate 13, and a hole pattern of the reticle 83 was transferred by the liquid immersion exposure method using ArF excimer laser as exposure light.

Figure 12B:
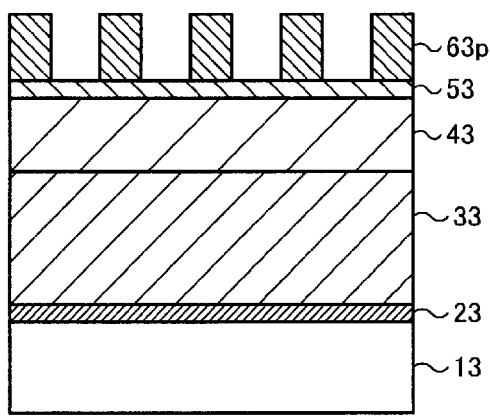

As illustrated in FIG. 12B, a resist pattern 63p having a hole pattern with a diameter of 100 nm was formed on the substrate 13.

Figure 12C:
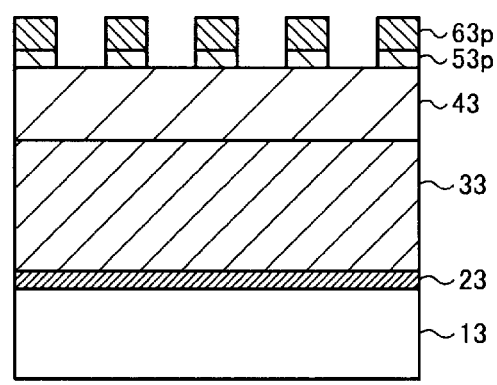

As illustrated in FIG. 12C, the SOG film 53 was processed using the resist pattern 63p as a mask to form an SOG film pattern 53p having a hole pattern.

Figure 12D:
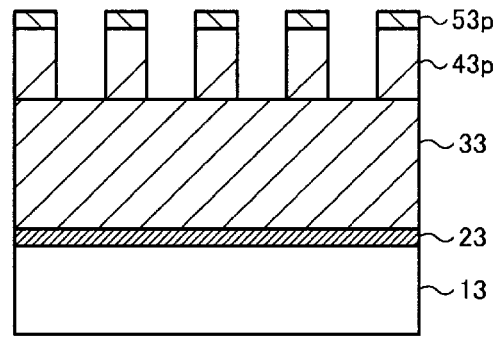

As illustrated in FIG. 12D, the SOC film 43 was processed using the SOG film pattern 53p as a mask to form an SOC film pattern 43p having a hole pattern. As a result, the resist pattern 63p disappeared.

In order to perform the metal infiltration treatment on the sample of Example 3, the substrate 13 on which the above SOC film pattern 43p was formed was loaded into the treatment container of the substrate treatment apparatus, and the inside of the treatment container was temporarily depressurized to 10 Pa. Thereafter, the temperature of the substrate 13 was raised to 200° C. so that the SOC film pattern 43p had an appropriate treatment temperature.

Figure 13A:
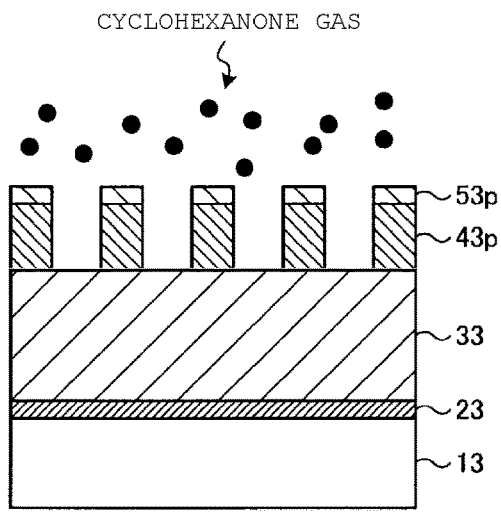
FIGS. 13A to 13E are cross-sectional views illustrating procedures of methods of preparing the samples according to Example 3 and Comparative example 3.

As illustrated in FIG. 13A, at a treatment temperature of 200° C., cyclohexanone gas was supplied into the treatment container to regulate the pressure to 100 Pa, and the substrate 13 was held for 5 minutes.

Figure 13B:
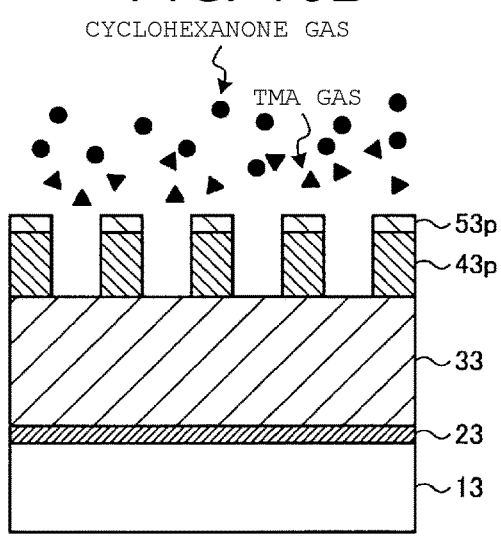

As illustrated in FIG. 13B, while maintaining the treatment temperature at 200° C., TMA gas was supplied into the treatment container to regulate the pressure to 100 Pa. As a result, the total pressure in the treatment container is 200 Pa. In this state, the substrate 13 was held for 5 minutes. The pressure in the treatment container was depressurized to 10 Pa, and the cyclohexanone gas and TMA gas remaining in the treatment container were discharged.

Figure 13D:
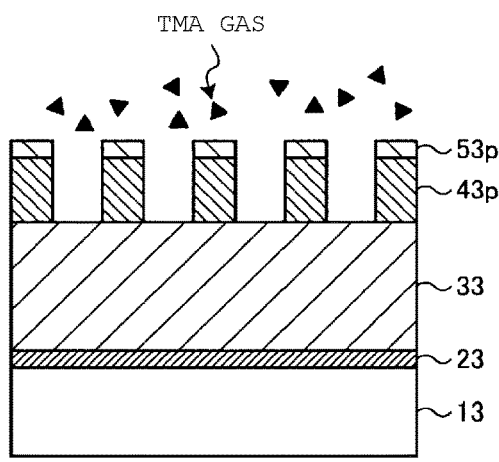
Figure 13C:
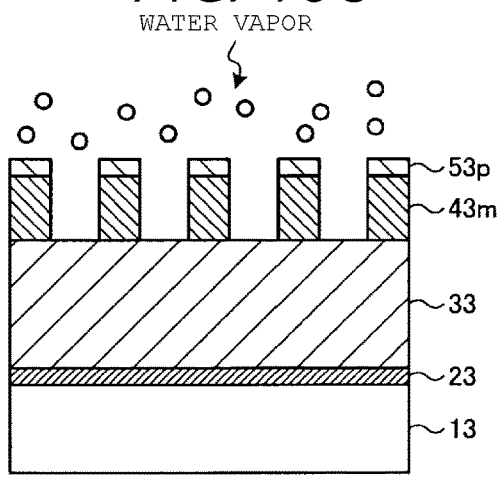

As illustrated in FIG. 13C, while maintaining the treatment temperature at 200° C., water vapor was supplied into the treatment container to regulate the pressure to 250 Pa, and the substrate 13 was held for 3 minutes. Thereafter, the pressure in the treatment container was depressurized to 10 Pa, and the water vapor remaining in the treatment container was discharged.

Thereafter, the substrate 13 was cooled while purging the inside of the treatment container with nitrogen gas to return to the atmospheric pressure. As described above, the SOC film pattern 43m of Example 3 was obtained.

Figure 13E:
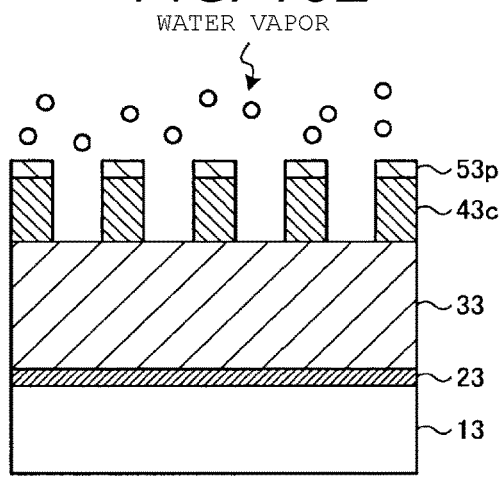

On the other hand, in order to perform the metal infiltration treatment on the sample of Comparative Example 3, the substrate 13 subjected to the treatment up to FIG. 12B was subjected to the treatments of FIGS. 13D and 13E. At this time, the sample of Comparative Example 3 was treated in the same manner as the sample of Example 3 except that the cyclohexanone gas was not supplied.

That is, as illustrated in FIG. 13D, the substrate 13 was exposed to the TMA gas for 5 minutes at a treatment temperature of 200° C. and a pressure of 100 Pa. After the pressure was temporarily depressurized to 10 Pa, the substrate 13 was treated with water vapor for 3 minutes at a pressure of 250 Pa as illustrated in FIG. 13E. After depressurizing the pressure to 10 Pa again, the substrate 13 was cooled while purging the inside of the treatment container with nitrogen gas to return to atmospheric pressure. As described above, the SOC film pattern 43c of Comparative Example 3 was obtained.

When a cross section of the SOC film pattern 43m of Example 3 was observed by TEM and a composition analysis was performed by EDX, approximately 15 at % Al atoms were confirmed in the SOC film pattern 43m. As described above, it was found that the SOC film pattern 43m may be infiltrated with Al atoms with a high concentration, similar to the resist patterns 61m and 62m of Examples 1 and 2 described above.

In addition, when the RIE treatment using a $CF_4/O_2$ gas system was performed on the base $SiO_2$ film 33 using the SOC film pattern 43m of Example 3 as a mask, a sufficient selection ratio for the SOC film pattern 43m was obtained, and a hole pattern could be formed in the $SiO_2$ film 33 having a thickness of 1000 nm.

When a cross section of the SOC film pattern 43c of Comparative Example 3 was observed by TEM and a composition analysis was performed by EDX, Al atoms were measured at a concentration of approximately 5 at %. As described above, it was found that when the metal infiltration treatment was performed at the same temperature as in Example 3 without performing the solvent annealing treatment, the amount of Al atoms infiltrated into the SOC film pattern 43c was reduced.

Subsequently, a sample in which an SOC film having a thickness of 300 nm formed in the same manner using the same type of material as the above sample was subjected to the metal infiltration treatment of FIGS. 13A to 13C without patterning was used as Example 3 in the same manner as above.

In addition, a sample in which an SOC film having a thickness of 300 nm formed in the same manner using the same type of material as the above sample was subjected to the metal infiltration treatment of FIGS. 13D and 13E without patterning was used as Comparative Example 3 in the same manner as above.

In addition, a sample in which an SOC film using the same type of material as the above sample, and changing the post bake temperature to 200° C. to reduce the crosslink density was subjected to the metal infiltration treatment of FIGS. 13D and 13E without patterning was used as Comparative Example 4.

When a composition analysis of the SOC film of Example 3 in the film depth direction was performed by XPS, Al atoms were measured at a concentration of 15 at % from the vicinity of the surface layer of the SOC film to the vicinity of the substrate. From this result, it was found that the SOC film pattern 43m may be infiltrated with Al atoms with high concentration.

When a composition analysis of the SOC film of Comparative Example 3 in the film depth direction was performed by XPS, although approximately 10 at % Al atoms were measured in the vicinity of the surface layer of the SOC film, the concentration of Al atoms decreased to approximately 5 at % on the substrate side. From this result, it is found that when the metal infiltration treatment is performed without performing the solvent annealing treatment, a sufficient infiltration concentration is not obtained.

When a composition analysis of the SOC film of Comparative Example 4 in the film depth direction was performed by XPS, Al atoms were measured at a concentration of 15 at % from the surface layer portion of the SOC film to the substrate side. From this result, in the SOC film pattern 43c and the SOC film of Comparative Example 3 described above, the reason why the infiltrated amount of Al atoms is low is presumed to be that the diffusion of TMA molecules into the SOC film pattern 43p having a high crosslink density was inhibited. In addition, it is found that the solvent annealing treatment used in Example 3 has the effect of alleviating the influence of such a crosslink density.

Example 4

As Example 4, a treatment of infiltrating an SOC film to which the resist pattern was transferred with aluminum was performed. The sample of Example 4 is different from the sample of Example 3 described above in that the sample of Example 4 does not have a tungsten film on the substrate and a $SiO_2$ film is directly formed to a thickness of 1000 nm. Other film types, film thickness, forming method, and stacking order of films are the same as those of the sample of Example 3 described above. In addition, the metal infiltration treatment for the SOC film pattern on the substrate was also performed in the same manner as the sample of Example 3 described above.

When a cross section of the SOC film pattern of Example 4 subjected to the metal infiltration treatment was observed by TEM and a composition analysis was performed by EDX, approximately 15 at % Al atoms were confirmed in the SOC film pattern.

When the RIE treatment was performed on the base $SiO_2$ film using the SOC film pattern of Example 4 subjected to the metal infiltration treatment as a mask, under the same conditions as in Example 3 described above, a sufficient selection ratio for the SOC film pattern was obtained, and a hole pattern could be formed in the $SiO_2$ film having a thickness of 1000 nm.

Subsequently, a sample in which an SOC film having the thickness of 300 nm formed in the same manner using the same type of material as the above sample was subjected to the metal infiltration treatment of FIGS. 13A to 13C without patterning was used as Example 4 in the same manner as above.

When a composition analysis on the SOC film of Example 4 in the film depth direction was performed by XPS, Al atoms were measured at a concentration of 15 at % from the vicinity of the surface layer of the SOC film to the vicinity of the substrate.

As described above, also in the sample of Example 4 having no tungsten film on the substrate, the same result as that of the sample of Example 3 described above was obtained.

Example 5

As Example 5, a treatment of infiltrating an SOC film to which the resist pattern was transferred with aluminum was performed. The sample of Example 5 was formed in the same manner as the sample of Example 4, and during the metal infiltration treatment, a mixed gas of a precursor and an organic solvent was used as the metal-containing gas.

FIGS. 14 and 15 are cross-sectional views illustrating a procedure of a method of preparing a sample according to Example 5.

Figure 14A:
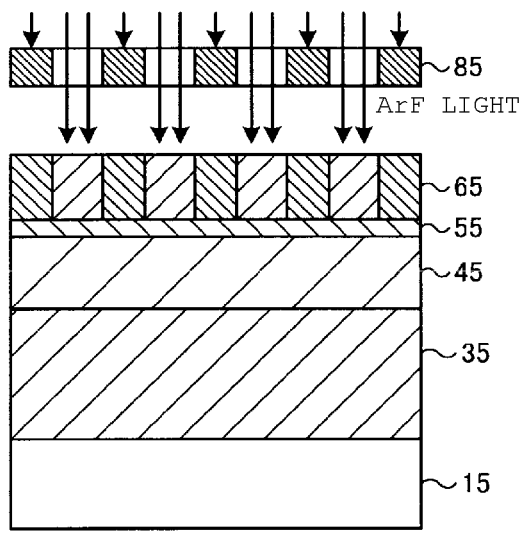
FIGS. 14A to 14D are cross-sectional views illustrating a procedure of a method of preparing a sample according to Example 5.

As illustrated in FIG. 14A, a $SiO_2$ film 35 was formed on the substrate 15 to a thickness of 1000 nm.

In addition, an SOC film 45 was formed on the $SiO_2$ film 35 to a thickness of 300 nm by a spin coating method. The post bake temperature at this time was 250° C. The SOC film 45 used here is also made of a material having an acrylic resin or a methacrylic resin as a main component and having an ester bond.

In addition, a SOG film 55 was formed on the SOC film 45 to a thickness of 40 nm by the spin coating method, and a positive resist film 65 was formed on the SOG film 55 to a thickness of 100 nm by the spin coating method.

A reticle 85 was opposed to the resist film 65 on the substrate 15, and a hole pattern of the reticle 85 was transferred by the liquid immersion exposure method using ArF excimer laser as exposure light.

Figure 14B:
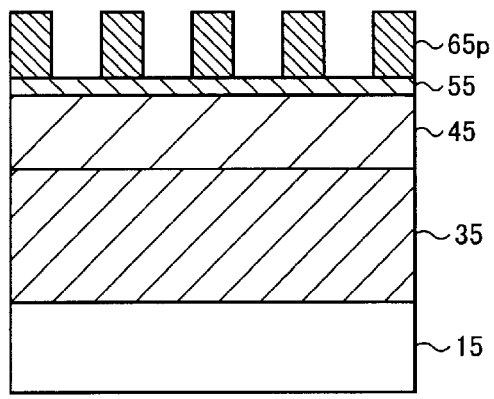

As illustrated in FIG. 14B, a resist pattern 65p having a hole pattern with a diameter of 100 nm was formed on the substrate 15.

Figure 14C:
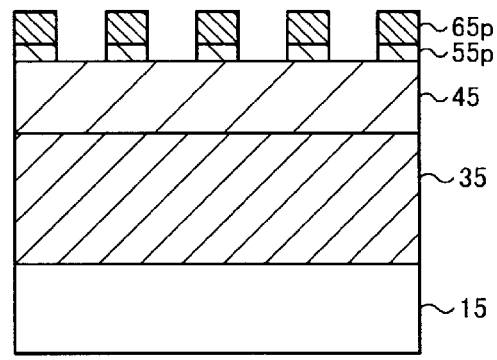

As illustrated in FIG. 14C, the SOG film 55 was processed using the resist pattern 65p as a mask to form an SOG film pattern 55p having a hole pattern.

Figure 14D:
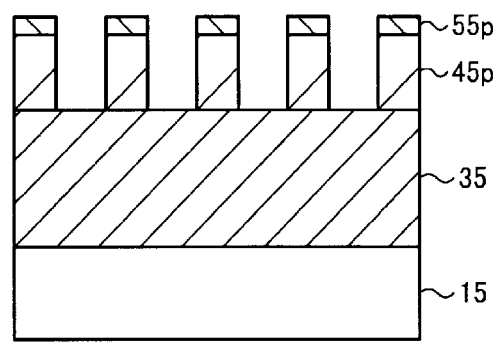

As illustrated in FIG. 14D, the SOC film 45 was processed using the SOG film pattern 55p as a mask to form an SOC film pattern 45p having a hole pattern. As a result, the resist pattern 65p disappeared.

Thereafter, the substrate 15 having the SOC film pattern 45p formed thereon was loaded into the treatment container of the substrate treatment apparatus, and the inside of the treatment container was depressurized to 10 Pa. The temperature of the substrate 15 was raised to 200° C. so that the SOC film pattern 45p had an appropriate treatment temperature.

Figure 15A:
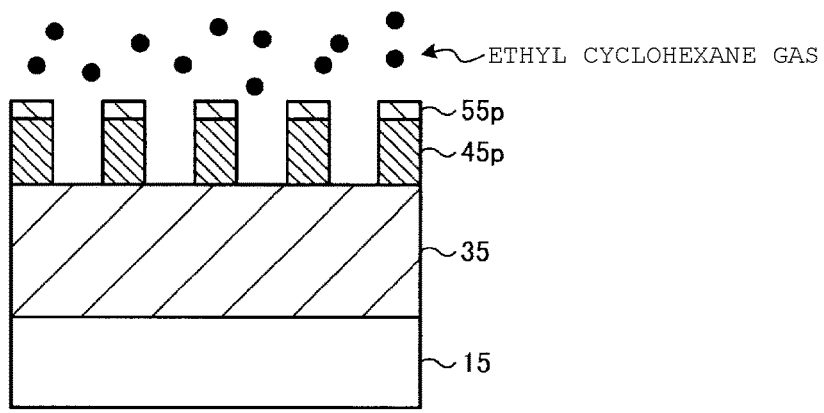
FIGS. 15A to 15C are cross-sectional views illustrating a procedure of a method of preparing the sample according to Example 5.

As illustrated in FIG. 15A, at a treatment temperature of 200° C., ethyl cyclohexane gas was supplied into the treatment container to regulate the pressure to 50 Pa, and the substrate 15 was held for 5 minutes.

Figure 15B:
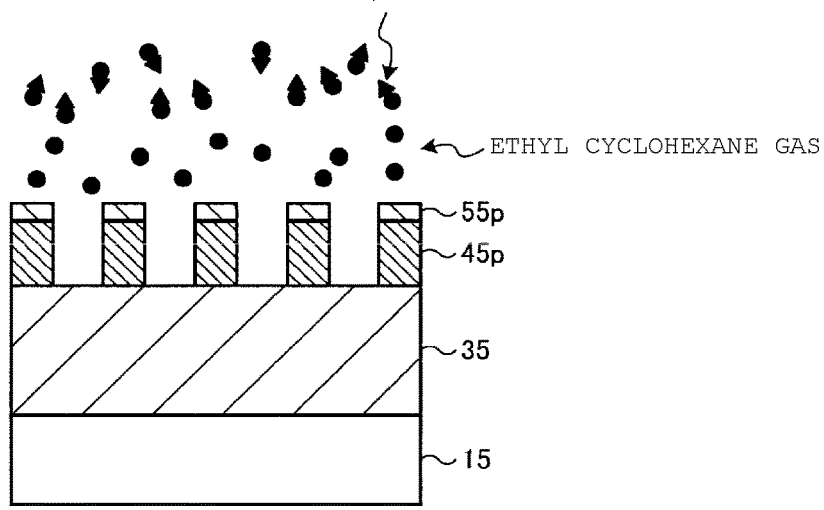

As illustrated in FIG. 15B, while maintaining the treatment temperature at 200° C., a mixed gas of TMA and ethyl cyclohexane was supplied into the treatment container to regulate the total pressure in the treatment container to 200 Pa. In this state, the substrate 15 was held for 5 minutes.

As described above, ethyl cyclohexane is suitable both as an organic solvent used for the solvent annealing treatment and as an organic solvent mixed with a precursor such as TMA during the metal infiltration treatment.

Thereafter, the pressure in the treatment container was depressurized to 10 Pa, and ethyl cyclohexane gas and a mixed gas of TMA and ethyl cyclohexane remaining in the treatment container were discharged.

Figure 15C:
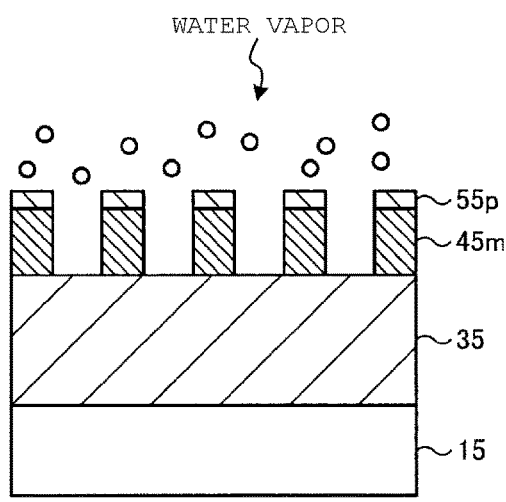

As illustrated in FIG. 15C, while maintaining the treatment temperature at 200° C., water vapor was supplied into the treatment container to regulate the pressure to 250 Pa, and the substrate 15 was held for 3 minutes. Thereafter, the pressure in the treatment container was depressurized to 10 Pa, and the water vapor remaining in the treatment container was discharged.

Thereafter, the substrate 15 was cooled while purging the inside of the treatment container with nitrogen gas to return to the atmospheric pressure. As described above, the SOC film pattern 45m of Example 5 was obtained.

When a cross section of the SOC film pattern 45m of Example 5 was observed by TEM and a composition analysis was performed by EDX, approximately 15 at % Al atoms were confirmed in the SOC film pattern 45m. As described above, it was found that the SOC film pattern 45m may be infiltrated with Al atoms with a high concentration, even when being exposed to a mixed gas of a precursor such as TMA and an organic solvent such as ethyl cyclohexane during the metal infiltration treatment.

Subsequently, a sample in which an SOC film having a thickness of 300 nm formed in the same manner by using the same type of material as the above sample was subjected to the metal infiltration treatment of FIGS. 15A to 15C without patterning was used as Example 5 in the same manner as above.

When a composition analysis of the SOC film of Example 5 in the film depth direction was performed by XPS, Al atoms were measured at a concentration of 15 at % from the vicinity of the surface layer of the SOC film to the vicinity of the substrate. From this result, it was found that the metal infiltration treatment using the mixed gas of the precursor and the organic solvent is effective.

As described above, also in the sample of Example 5 using the mixed gas of the precursor and the organic solvent, the same result as that of the sample of Example 4 described above was obtained.

Example 6

As Example 6, a treatment of infiltrating an SOC film to which the resist pattern was transferred with gallium was performed.

FIGS. 16A-16G are cross-sectional views illustrating a procedure of a method of preparing a sample according to Example 6.

Figure 16A:
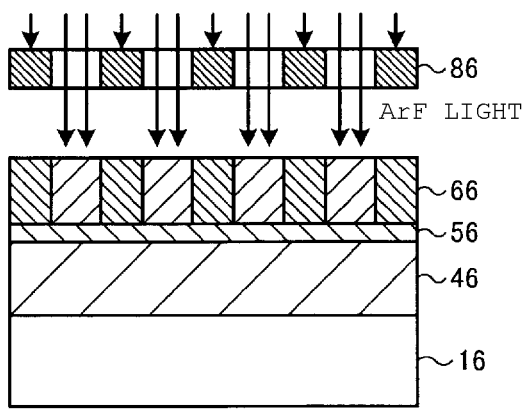
FIGS. 16A to 16G are cross-sectional views illustrating a procedure of a method of preparing a sample according to Example 6.

As illustrated in FIG. 16A, the SOC film 46 was formed on the substrate 16 to a thickness of 300 nm by the spin coating method. The post bake temperature at this time was 250° C. In addition, a SOG film 56 was formed on the SOC film 46 to a thickness of 40 nm by the spin coating method, and a positive resist film 66 was formed on the SOG film 56 to a thickness of 100 nm by the spin coating method.

A reticle 86 was opposed to the resist film 66 on the substrate 16, and a hole pattern of the reticle 86 was transferred by the liquid immersion exposure method using ArF excimer laser as exposure light.

Figure 16B:
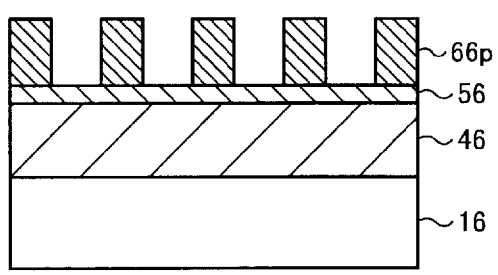

As illustrated in FIG. 16B, a resist pattern 66p having a hole pattern with a diameter of 100 nm was formed on the substrate 16.

Figure 16C:
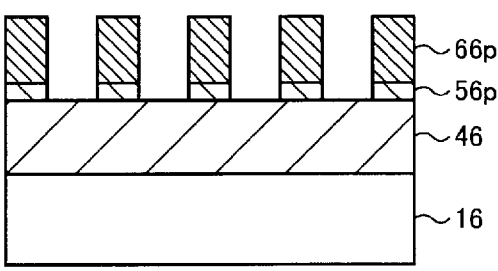

As illustrated in FIG. 16C, the SOG film 56 was processed using the resist pattern 66p as a mask to form an SOG film pattern 56p having a hole pattern.

Figure 16D:
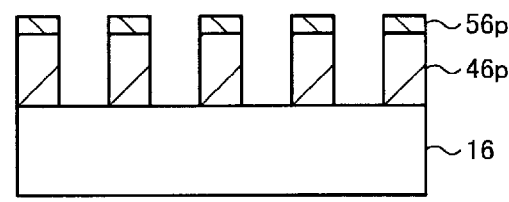

As illustrated in FIG. 16D, the SOC film 46 was processed using the SOG film pattern 56p as a mask to form an SOC film pattern 46p having a hole pattern. As a result, the resist pattern 66p disappeared.

Thereafter, the substrate 16 having the SOC film pattern 46p formed thereon was loaded into the treatment container of the substrate treatment apparatus, and the inside of the treatment container was temporarily depressurized to 10 Pa. The temperature of the substrate 16 was raised to 200° C. so that the SOC film pattern 46p had an appropriate treatment temperature.

Figure 16E:
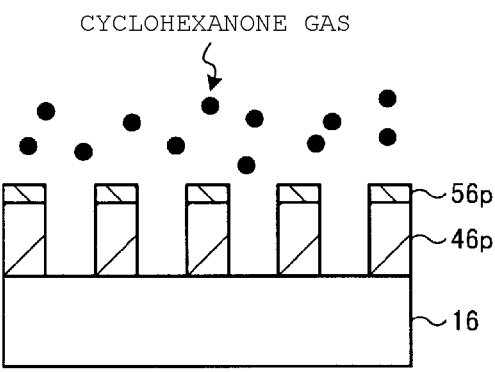

As illustrated in FIG. 16E, at a treatment temperature of 200° C., cyclohexanone gas was supplied into the treatment container to regulate the pressure to 50 Pa, and the substrate 16 was held for 5 minutes.

Figure 16F:
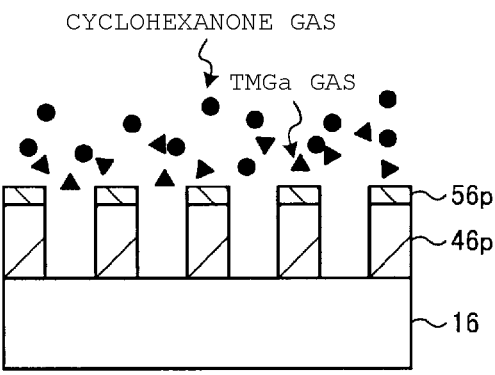

As illustrated in FIG. 16F, TMGa gas was supplied into the treatment container while maintaining the treatment temperature at 200° C., and the total pressure in the treatment container was regulated to 300 Pa. In this state, the substrate 16 was held for 5 minutes. Thereafter, the pressure in the treatment container was depressurized to 10 Pa, and the cyclohexanone gas and TMGa gas remaining in the treatment container were discharged.

Figure 16G:
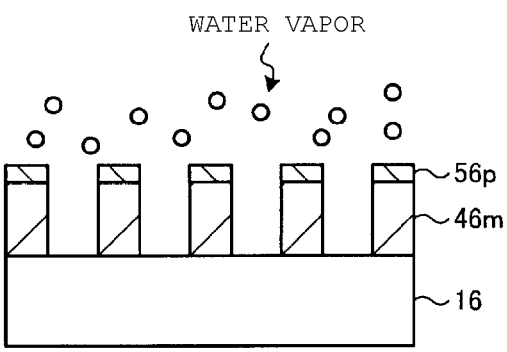

As illustrated in FIG. 16G, while maintaining the treatment temperature at 200° C., water vapor was supplied into the treatment container to regulate the pressure to 250 Pa, and the substrate 16 was held for 3 minutes. Thereafter, the pressure in the treatment container was depressurized to 10 Pa, and the water vapor remaining in the treatment container was discharged.

Thereafter, the substrate 16 was cooled while purging the inside of the treatment container with nitrogen gas to return to the atmospheric pressure. As described above, the SOC film pattern 46m of Example 6 was obtained.

When a cross section of the SOC film pattern 46m of Example 6 was observed by TEM and a composition analysis was performed by EDX, approximately 5 at % Ga atoms were confirmed in the SOC film pattern 46m. As a result, it was found that Ga atoms may also be infiltrated into the SOC film pattern 46m by combining the solvent annealing treatment and the metal infiltration treatment.

Example 7

As Example 7, a treatment of infiltrating an SOC film to which the resist pattern was transferred with indium was performed. The sample of Example 7 was formed in the same manner as the sample of Example 6 described above, such as film type, film thickness, forming method, and stacking order of films.

In order to perform the metal infiltration treatment on the SOC film pattern of Example 7, the substrate on which the SOC film pattern was formed was loaded into the treatment container of the substrate treatment apparatus, and the inside of the treatment container was temporarily depressurized to 10 Pa. Thereafter, the temperature of the substrate was raised to 200° C. so that the SOC film pattern had an appropriate treatment temperature.

At a treatment temperature of 200° C., cyclohexanone gas was supplied into the treatment container to regulate the pressure to 50 Pa, and the substrate was held for 5 minutes.

While maintaining the treatment temperature at 200° C., TMI gas was supplied into the treatment container so that the total pressure in the treatment container was 300 Pa. In this state, the substrate was held for 5 minutes. Thereafter, the pressure in the treatment container was depressurized to 10 Pa, and cyclohexanone gas and TMI gas remaining in the treatment container were discharged.

While maintaining the treatment temperature at 200° C., water vapor was supplied into the treatment container to regulate the pressure to 250 Pa, and the substrate was held for 3 minutes. Thereafter, the pressure in the treatment container was depressurized to 10 Pa, and the water vapor remaining in the treatment container was discharged.

Thereafter, the substrate was cooled while purging the inside of the treatment container with nitrogen gas to return to atmospheric pressure. As described above, the SOC film pattern of Example 7 subjected to the metal infiltration treatment was obtained.

When a cross section of the SOC film pattern of Example 7 subjected to the metal infiltration treatment was observed by TEM and a composition analysis was performed by EDX, approximately 10 at % of In atoms were confirmed in the SOC film pattern. As a result, it was found that In atoms may also be infiltrated into the SOC film pattern by combining the solvent annealing treatment and the metal infiltration treatment.

Example 8

As Example 8, a treatment of infiltrating an SOC film to which the resist pattern was transferred with titanium was performed, using titanium chloride ($TiCl_4$) having a small molecular size as a precursor. The sample of Example 8 was formed in the same manner as the sample of Example 6 described above, such as film type, film thickness, forming method, and stacking order of films.

In order to perform the metal infiltration treatment on the SOC film pattern of Example 8, the substrate on which the SOC film pattern was formed was loaded into the treatment container of the substrate treatment apparatus, and the inside of the treatment container was temporarily depressurized to 10 Pa. Thereafter, the temperature of the substrate was raised to 200° C. so that the SOC film pattern had an appropriate treatment temperature.

At a treatment temperature of 200° C., cyclohexanone gas was supplied into the treatment container to regulate the pressure to 50 Pa, and the substrate was held for 5 minutes.

While maintaining the treatment temperature at 200° C., $TiCl_4$ gas was supplied into the treatment container so that the total pressure in the treatment container was 900 Pa. In this state, the substrate was held for 5 minutes. Thereafter, the pressure in the treatment container was depressurized to 10 Pa, and the cyclohexanone gas and $TiCl_4$ gas remaining in the treatment container were discharged.

While maintaining the treatment temperature at 200° C., ozone gas was supplied into the treatment container to regulate the pressure to 250 Pa, and the substrate was held for 1 minute. Thereafter, the pressure in the treatment container was depressurized to 10 Pa, and the ozone gas remaining in the treatment container was discharged.

Thereafter, the substrate was cooled while purging the inside of the treatment container with nitrogen gas to return to atmospheric pressure. As described above, the SOC film pattern of Example 8 subjected to the metal infiltration treatment was obtained.

When a cross section of the SOC film pattern of Example 8 subjected to the metal infiltration treatment was observed by TEM and a composition analysis was performed by EDX, approximately 5 at % of In atoms were confirmed in the SOC film pattern. As a result, it was found that Ti atoms may also be infiltrated into the SOC film pattern by combining the solvent annealing treatment and the metal infiltration treatment.

Example 9

As Example 9, a treatment of infiltrating an SOC film to which the resist pattern was transferred with titanium was performed, using TDMAT having a large molecular size as a precursor. The sample of Example 9 was formed in the same manner as the sample of Example 6 described above, such as film type, film thickness, forming method, and stacking order of films.

In order to perform the metal infiltration treatment on the SOC film pattern of Example 9, the substrate on which the SOC film pattern was formed was loaded into the treatment container of the substrate treatment apparatus, and the inside of the treatment container was temporarily depressurized to 10 Pa. Thereafter, the temperature of the substrate was raised to 200° C. so that the SOC film pattern had an appropriate treatment temperature.

At a treatment temperature of 200° C., cyclohexanone gas was supplied into the treatment container to regulate the pressure to 50 Pa, and the substrate was held for 5 minutes.

While maintaining the treatment temperature at 200° C., TDMAT gas was supplied into the treatment container so that the total pressure in the treatment container was 130 Pa. In this state, the substrate was held for 5 minutes. Thereafter, the pressure in the treatment container was depressurized to 10 Pa, and the cyclohexanone gas and TDMAT gas remaining in the treatment container were discharged.

While maintaining the treatment temperature at 200° C., ozone gas was supplied into the treatment container to regulate the pressure to 300 Pa, and the substrate was held for 1 minute. Thereafter, the pressure in the treatment container was depressurized to 10 Pa, and the ozone gas remaining in the treatment container was discharged.

Thereafter, the substrate was cooled while purging the inside of the treatment container with nitrogen gas to return to atmospheric pressure. As described above, the SOC film pattern of Example 9 subjected to the metal infiltration treatment was obtained.

When a cross section of the SOC film pattern of Example 9 subjected to the metal infiltration treatment was observed by TEM and a composition analysis was performed by EDX, approximately 5 at % of Ti atoms were confirmed in the SOC film pattern.

As described above, also in the sample of Example 9, the same result as that of the sample of Example 8 was obtained. From this result, it was found that results comparable to those using $TiCl_4$ having a small molecular size were obtained, even when TDMAT having a large molecular size was used for the precursor.

Example 10

As Example 10, a treatment of infiltrating an SOC film to which a resist pattern was transferred with hafnium was performed, using TDMAH having a large molecular size as a precursor. The sample of Example 10 was formed in the same manner as the sample of Example 6 described above, such as film type, film thickness, forming method, and stacking order of films.

In order to perform the metal infiltration treatment on the SOC film pattern of Embodiment 10, the substrate on which the SOC film pattern was formed was loaded into the treatment container of the substrate treatment apparatus, and the pressure inside the treatment container was temporarily depressurized to 10 Pa. Thereafter, the temperature of the substrate was raised to 200° C. so that the SOC film pattern had an appropriate treatment temperature.

At a treatment temperature of 200° C., cyclohexanone gas was supplied into the treatment container to regulate the pressure to 50 Pa, and the substrate was held for 5 minutes.

While maintaining the treatment temperature at 200° C., TDMAH gas was supplied into the treatment container so that the total pressure in the treatment container was 650 Pa. In this state, the substrate was held for 5 minutes. Thereafter, the pressure in the treatment container is depressurized to 10 Pa, and cyclohexanone gas and TDMAH gas remaining in the treatment container were discharged.

While maintaining the treatment temperature at 200° C., water vapor was supplied into the treatment container to regulate the pressure to 250 Pa, and the substrate was held for 3 minutes. Thereafter, the pressure in the treatment container was depressurized to 10 Pa, and the water vapor remaining in the treatment container was discharged.

Thereafter, the substrate was cooled while purging the inside of the treatment container with nitrogen gas to return to atmospheric pressure. As described above, the SOC film pattern of Example 10 subjected to the metal infiltration treatment was obtained.

When a cross section of the SOC film pattern of Example 10 subjected to the metal infiltration treatment was observed by TEM and a composition analysis was performed by EDX, approximately 3 at % of Hf atoms were confirmed in the SOC film pattern. As a result, it was found that Hf atoms may be infiltrated into the SOC film pattern even when TDMAH having a large molecular size is used as a precursor, by combining the solvent annealing treatment and the metal infiltration treatment.

Example 11

As Example 11, a treatment of infiltrating an SOC film to which the resist pattern was transferred with zirconium was performed, using TDMAZ having a large molecular size as a precursor. The sample of Example 11 was formed in the same manner as the sample of Example 6 described above, such as the film type, film thickness, forming method, and stacking order of films.

In order to perform the metal infiltration treatment on the SOC film pattern of Embodiment 11, the substrate on which the SOC film pattern was formed was loaded into the treatment container of the substrate treatment apparatus, and the inside of the treatment container was temporarily depressurized to 10 Pa. Thereafter, the temperature of the substrate was raised to 200° C. so that the SOC film pattern had an appropriate treatment temperature.

At a treatment temperature of 200° C., cyclohexanone gas was supplied into the treatment container to regulate the pressure to 50 Pa, and the substrate was held for 5 minutes.

While maintaining the treatment temperature at 200° C., TDMAZ gas was supplied into the treatment container so that the total pressure in the treatment container was 650 Pa. In this state, the substrate was held for 5 minutes. Thereafter, the pressure in the treatment container was depressurized to 10 Pa, and the cyclohexanone gas and TDMAZ gas remaining in the treatment container were discharged.

While maintaining the treatment temperature at 200° C., water vapor was supplied into the treatment container to regulate the pressure to 250 Pa, and the substrate was held for 3 minutes. Thereafter, the pressure in the treatment container was depressurized to 10 Pa, and the water vapor remaining in the treatment container was discharged.

Thereafter, the substrate was cooled while purging the inside of the treatment container with nitrogen gas to return to atmospheric pressure. As described above, the SOC film pattern of Example 11 subjected to the metal infiltration treatment was obtained.

When a cross section of the SOC film pattern of Example 11 subjected to the metal infiltration treatment was observed by TEM and a composition analysis was performed by EDX, approximately 3 at % Zr atoms were confirmed in the SOC film pattern. As a result, it was found that Zr atoms may be infiltrated into the SOC film pattern even when TDMAZ having a large molecular size is used for the precursor, by combining the solvent annealing treatment and the metal infiltration treatment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modification examples as would fall within the scope and spirit of the disclosure.

What is claimed is:
1. A pattern formation method comprising:
forming an organic film on a substrate;
processing the organic film to form an organic film pattern;
after forming the organic film pattern, exposing the organic film pattern to an organic gas;
after exposing the organic film pattern to the organic gas, exposing the organic film pattern to a metal-containing gas; and
after exposing the organic film pattern to the metal-containing gas, treating the organic film pattern with an oxidizing agent.

2. The pattern formation method according to claim 1, wherein
the exposing the organic film pattern to the organic gas includes performing a solvent annealing treatment on the organic film pattern to increase a free volume of the organic film pattern, the free volume being a volume not filled by a polymer in an actual volume of the polymer in the organic film pattern, and
the exposing the organic film pattern to the metal-containing gas includes infiltrating the organic film pattern with a metal from the metal-containing gas.

3. The pattern formation method according to claim 1, wherein
when exposing the organic film pattern to the organic gas and the metal-containing gas,
the substrate is controlled to a temperature equal to or lower than a glass transition point of a polymer contained as a main component, among polymers in the organic film pattern.

4. The pattern formation method according to claim 1, wherein
the exposing the organic film pattern to the organic gas includes exposing the organic film pattern to a gas of at least one organic solvent selected from the group consisting of chain ketones, cyclic ketones, aliphatic hydrocarbons, aromatic hydrocarbons, and ethers, and
the exposing the organic film pattern to the metal-containing gas includes exposing the organic film pattern to a gas containing at least one of aluminum, gallium, indium, chromium, manganese, molybdenum, tungsten, titanium, zirconium, or hafnium.

5. The pattern formation method according to claim 1, wherein
the exposing the organic film pattern to the organic gas is started no later than starting the exposing the organic film pattern to the metal-containing gas.

6. The pattern formation method according to claim 1, wherein the organic film pattern has a cross link density of 1.3 gm/cm$^3$ or more.

7. The pattern formation method according to claim 1, wherein the organic film pattern is formed by a photolithography process.

8. The pattern formation method according to claim 1, wherein the organic film pattern comprises a resist or a resin material.

9. The pattern formation method according to claim 1, wherein the organic film pattern comprises a photoresist or spin-on-carbon.

10. The pattern formation method according to claim 1, wherein the organic film pattern comprises a polymer of acrylic acid ester or a copolymer of acrylic acid ester and methacrylic acid ester as a main component.

11. The pattern formation method according to claim 1, wherein when exposing the organic film pattern to the organic gas and the metal-containing gas, a maximum pressure of the metal-containing gas is greater than a maximum pressure of the organic gas.

12. The pattern formation method according to claim 1, wherein there is no time overlap between the exposing the organic film pattern to the organic gas and the metal-containing gas and the treating the organic film pattern with the oxidizing agent.

13. A method of manufacturing a semiconductor device comprising:
forming at least a film to be processed and an organic film in order on a substrate;
processing the organic film to form an organic film pattern;
after forming the organic film pattern, exposing the organic film pattern to an organic gas, and
after exposing the organic film pattern to the organic gas, exposing the organic film pattern to a metal-containing gas;
after exposing the organic film pattern to the metal-containing gas, treating the organic film pattern with an oxidizing agent; and
transferring a pattern of the organic film pattern onto the film to be processed.

14. The method of manufacturing a semiconductor device according to claim 13, further comprising removing the organic film pattern.

15. The method of manufacturing a semiconductor device according to claim 13, wherein
the exposing the organic film pattern to the organic gas includes performing
a solvent annealing treatment on the organic film pattern to increase a free volume of the organic film pattern, the free volume being a volume not filled by a polymer in an actual volume of the polymer in the organic film pattern, and
the exposing the organic film pattern to the metal-containing gas includes infiltrating the organic film pattern with a metal from the metal-containing gas.

16. The method of manufacturing a semiconductor device according to claim 13, wherein
when exposing the organic film pattern to the organic gas and the metal-containing gas,
the substrate is controlled to a temperature equal to or lower than a glass transition point of a polymer contained as a main component, among polymers in the organic film pattern.

17. The method of manufacturing a semiconductor device according to claim 13, wherein
the exposing the organic film pattern to the organic gas includes exposing the organic film pattern to a gas of at least one organic solvent selected from the group consisting of chain ketones, cyclic ketones, aliphatic hydrocarbons, aromatic hydrocarbons, and ethers, and
the exposing the organic film pattern to metal-containing gas includes exposing the organic film pattern to a gas containing at least one of aluminum, gallium, indium, chromium, manganese, molybdenum, tungsten, titanium, zirconium, or hafnium.

18. The method of manufacturing a semiconductor device according to claim 13, wherein
the exposing the organic film pattern to the organic gas is started no later than starting the exposing the organic film pattern to the metal-containing gas.

19. The method of manufacturing a semiconductor device according to claim 13, wherein the organic film pattern has a cross link density of 1.3 gm/cm$^3$ or more.

* * * * *